United States Patent [19]
Klein et al.

[11] Patent Number: 5,768,567
[45] Date of Patent: Jun. 16, 1998

[54] OPTIMIZING HARDWARE AND SOFTWARE CO-SIMULATOR

[75] Inventors: Russell Klein, Wilsonville; Peter Finch, Tigard; Devon Kehoe, Lake Oswego, all of Oreg.

[73] Assignee: Mentor Graphics Corporation, Wilsonville, Oreg.

[21] Appl. No.: 645,620

[22] Filed: May 14, 1996

[51] Int. Cl.$^6$ .................................................. G06F 9/455
[52] U.S. Cl. ........................ 395/500; 395/920; 364/578; 364/490
[58] Field of Search .................................. 395/500, 551; 364/578, 490

[56] References Cited

U.S. PATENT DOCUMENTS

| | | | |
|---|---|---|---|
| 4,868,770 | 9/1989 | Smith et al. | 364/578 |
| 5,493,672 | 2/1996 | Lau et al. | 395/500 |
| 5,546,562 | 8/1996 | Patel | 395/500 |
| 5,551,013 | 8/1996 | Beausoleil et al. | 395/500 |
| 5,640,546 | 6/1997 | Gopinath et al. | 395/551 |
| 5,663,900 | 9/1997 | Bhandari et al. | 364/578 |

OTHER PUBLICATIONS

"Hardware/Software Selected Cycle Solution", Author: John Wilson, 1994 IEEE, pp. 190–194.

"Synthesis & Simulation of Digital Systems Containing Interacting Hardware & Software Components", Authors: Gupta, Coelho, Jr., DeMicheli, 1992 IEEE, pp. 225–230.

"Realtime Software Development in Multi-Processor, Multi-Function Systems", by M. Minges, IEEE National Aerospace and Electronics, 1990 Conference (NAECON), p. 675–680.

"Miami: A Hardware Software Co-Simulation Environment", by R. Klein, IEEE Rapid System Prototyping, 1996 Workshop, May 1996, pp. 173–177.

*Primary Examiner*—Kevin J. Teska
*Assistant Examiner*—Russell W. Frejd
*Attorney, Agent, or Firm*—Blakely, Sokoloff, Taylor & Zafman, LLP

[57] ABSTRACT

An optimizing hardware-software co-simulator is constituted with a logic simulator, a number of bus interface models, a number of memory models, a number of instruction set simulators, and a co-simulation optimization manager for co-simulating a hardware-software system having memory. Co-simulation is performed with a single coherent view of the memory of the hardware-software system, transparently maintained by the co-simulation optimization manager for both the hardware and software simulations. This single coherent view includes at least one segment of the memory being viewed as configured for having selected portions of the segment to be statically or dynamically configured/reconfigured for either unoptimized or optimized accesses, wherein unoptimized accesses are performed through hardware simulation, and optimized accesses are performed "directly" by the co-simulation optimization manager, by-passing hardware simulation. Co-simulation of a hardware-software system is performed with or without the co-simulation optimization manager optimizing simulation time, which is statically or dynamically configured/ reconfigured, and optionally in accordance to a desired clock cycle ratio between hardware and software simulations, also statically or dynamically configured/reconfigured.

44 Claims, 19 Drawing Sheets

OPTIMIZING HARDWARE AND SOFTWARE CO-SIMULATOR

BACKGROUND OF THE INVENTION

1. Field of the Invention

The present invention relates to the field of digital system design verification. More specifically, the present invention relates to design verification of digital systems whose development efforts are neither hardware nor software dominant.

2. Background Information

The majority of digital systems being designed today are task specific embedded systems that consist of standard and/or custom hardware as well as standard and/or custom software. Standard hardware typically includes off-the-shelf microprocessor/micro-controller, and memory etc., whereas custom hardware is implemented with programmable logic devices (PLDs), or Application Specific Integrated Circuits (ASICs). Hardware architecture binds and constrains these resource and provides a framework on which software processes execute. Standard software typically includes a real time operating system (RTOS), and configurable device drivers, whereas customer software is the embedded application. Software architecture defines how these processes communicate.

The complexity of these systems varies widely from low to high end depending on the market segment and product goals. They can be found in almost everything that we encounter in our daily lives, such as communication systems ranging from the phone on our desk, to the large switching centers, automobiles, consumer electronics, etc.

Some embedded systems are software dominant in their development effort, in that most of the design efforts are focused on implementing the functionality in software. Typically, standard or previously designed hardware are employed. Thus, even though the software dominant characteristic typically makes these systems a lot more cost sensitive, these systems can be readily validated by compiling and debugging the software under development on existing hardware, using a compiler, a debugger and other related software tools.

Other embedded systems are hardware dominant, in that most of the design efforts are focused on implementing the functionality in PLDs or ASICs. The original software content of these systems tends to be small. Typically, these embedded systems are found in applications where performance is critical. For these systems, hardware emulation and/or simulation techniques known in the art appear to adequately serve the design verification needs. In the case of emulation, the hardware is "realized" by configuring the reconfigurable logic and interconnect elements of the emulator. The configuration information are generated by "compiling" certain formal behavioral specification/description of the hardware. In the case of simulation, a simulation model would be developed. For the more "complex" hardware, since it is very difficult, if not outright impossible, to model all the behaviors of the hardware, certain accuracy are often sacrificed. For example, in the case of a microprocessor, it is often modeled by a "bus interface model", i.e. only the different bus cycles that the processor can execute are modeled. The modeled bus cycles are driven in timed sequences, representative of typical bus transactions or bus activities for invoking specific conditions.

Embedded systems that are most difficult to validate are those that are neither software or hardware dominant, in that both parts play an equally important role in the success of the system. Due to increased time to market pressures, hardware and software are usually developed in parallel. Typically, the hardware designers would validate the hardware design using an hardware simulator or emulator. Concurrently, the software designer would validate the software using an instruction set simulator on a general purpose computer. The instruction set simulator simulates execution of compiled assembly/machine code for determining software correctness and performance at a gross level. These instruction set simulators often include facilitates for handling I/O data streams to simulate to a very limited degree the external hardware of the target design. Typically, instruction set simulators run at a speeds of ten thousand to several hundred thousand instructions per second, based on their level of detail and the performance of the host computer that they are being run on.

Traditionally, the hardware and software would not be validated together until at least a prototype of the hardware, having sufficient amount of functionality implemented and stabilized, becomes available. The software is executed with a hardware simulator, and very often in cooperation with a hardware modeler (a semiconductor tester), against which the hardware prototype is coupled. The hardware simulator provides the hardware modeler with the values on the input pins of the prototype hardware, which in turn drives these values onto the actual input pins of the prototype hardware. The hardware modeler samples the output pins of the prototype hardware and returns these values to the hardware simulator. Typically, only one to ten instructions per second can be achieved, which is substantially slower than instruction set simulation.

Recently, increasing amount of research effort in the industry has gone into improving hardware and software co-simulation. New communication approaches such as "message channels" implemented e.g. using UNIX® "pipes" have been employed to facilitate communication between the hardware and software models (UNIX is a registered trademark of Santa Cruz Software, Inc.). Other efforts have allowed the models to be "interconnected" through "registers", "queues", etc. However, even with the improved communication techniques, and employment of less complete models, such as "bus interface models" for a microprocessor, hardware and software co-simulation known in the art remain running substantially slower than instruction set simulation.

Thus, it is desirable if hardware and software can be co-simulated together at speed that is closer to instruction set simulation. As will be disclosed in more detail below, the present invention allows the user to selectively optimize the hardware and software co-simulation, achieving the above discussed and other desirable results.

SUMMARY OF THE INVENTION

An optimizing hardware-software co-simulator is constituted with a logic simulator, a number of bus interface models, a number of memory models, a number of instruction set simulators (ISS), and a co-simulation optimization manager for co-simulating hardware-software systems. In accordance to the present invention, co-simulation of a hardware-software system is performed with a single coherent view of the memory of the hardware-software system. The single coherent view is transparently maintained by the co-simulation optimization manager for both the hardware and software simulations performed by the logic simulator, the bus interface and memory models, and the ISS'. This single coherent view includes at least one segment of the memory being viewed as configured for having selected portions of the segment to be statically or dynamically configured/reconfigured for either unoptimized or optimized accesses, wherein unoptimized accesses are performed through hardware simulation, and optimized accesses are performed "directly" by the co-simulation optimization manager, by-passing hardware simulation, resulting in significant savings in simulation time. As a result, uninteresting or inconsequential memory accesses may be optimized away by the co-simulation optimization manager to significantly improve co-simulation performance, with little or no impact on the accuracy of the co-simulation results; and the amount of optimizations may be varied in between successive co-simulation runs or during a co-simulation run.

In accordance to the present invention, co-simulation of a hardware-software system is also performed with or without the co-simulation optimization manager optimizing simulation time, which is statically or dynamically configured/reconfigured, and optionally with the co-simulation optimization manager maintaining a desired clock cycle ratio between hardware and software simulations, also statically or dynamically configured/reconfigured. As a result, hardware simulation can be ensured to advance even if software simulation results in no unoptimized memory accesses, if the co-simulation is performed with optimized memory accesses.

In another implementation, the optimizing hardware-software co-simulator of the present invention further includes a configuration manager having an end user interface for a user to configure the hardware-software co-simulator for co-simulation. The configuration includes associating a processor instance with an ISS, establishing the communication connection between the processor instance and the associated ISS, establishing the coherent view of memory, establishing the address ranges for optimized memory accesses, and establishing the desired simulation clock cycle ratio. The first three of these configurations are performed statically, whereas the last two may be performed statically and/or dynamically.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily order dependent, in particular, the order of presentation.

Figure 1:
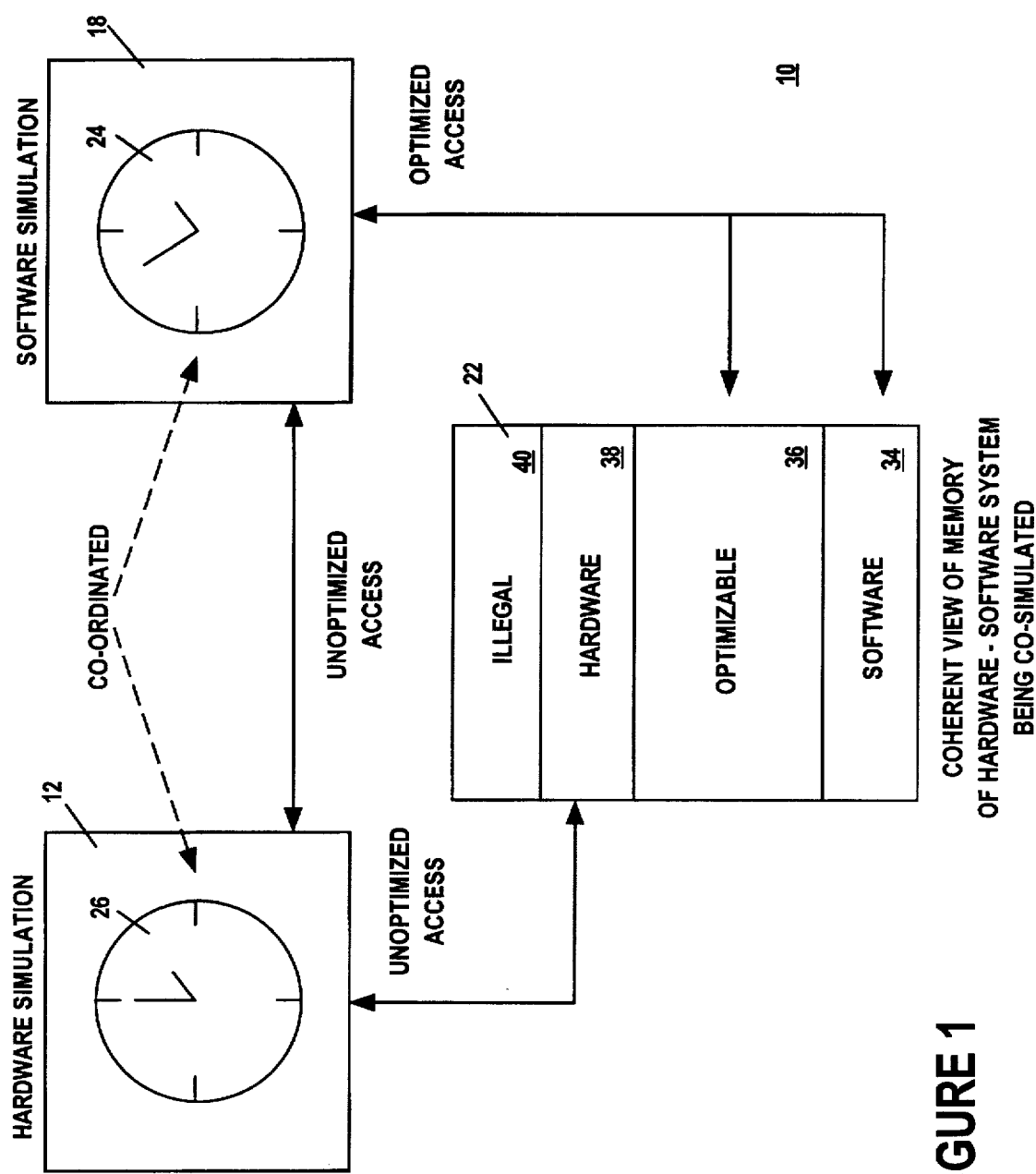
FIG. 1 gives a broad overview of the present invention.

Referring now FIG. 1, wherein a broad overview of the present invention is shown. As illustrated, in accordance with a first aspect of the present invention, a hardware-software system co-simulation 10 comprising hardware and software simulations 12 and 18, is performed with a single coherent view 22 of the memory of the hardware-software system being co-simulated. This single coherent view 22 is transparently maintained for hardware and software simulations 12 and 18. Within this single coherent view 22, different memory segments are viewed as having been configured for different usage, including at least one memory segment 36 being viewed as configured to have selected portions of memory segment 36 statically or dynamically configured/reconfigured for either unoptimized or optimized accesses, wherein unoptimized accesses are performed through hardware simulation 12, and optimized accesses are performed "directly", by-passing hardware simulation 12. An example of memory 36, i.e. memory eligible to be configured for either unoptimized or optimized access, is data and stack memory. As will be appreciated by those skilled in the art, optimized accesses performed in this "by-pass" manner result in significant savings in simulation time.

Preferably, this single coherent view 22 may further include a memory segment 34 being viewed as having been configured for software simulation access only, a memory segment 38 being viewed as having been configured for hardware simulation access only, and/or a memory segment 40 being viewed as having been reserved. An example of memory 34, i.e. memory configured for software simulation only, is read-only-memory (ROM). An example of memory 38, i.e. memory configured for hardware simulation only, is memory mapped input/output (I/O).

In accordance to a second aspect of the present invention, hardware-software co-simulation 10 is performed with or without simulation time optimized, statically or dynamically configured/reconfigured, and optionally in accordance to a desired clock cycle ratio between hardware simulation 12 and software simulation 18, also statically or dynamically configured/reconfigured. As a result, hardware simulation 12 is ensured to advance, even if software simulation 18 did not result in any unoptimized memory access, if the co-simulation is performed with optimized memory accesses.

As will be described in more detail below, once configured and co-simulation starts, software simulation 18 will proceed until software simulation 18 encounters an unoptimized memory access, or until software simulation 18 has proceeded by a first predetermined quantity of clock cycles 24. If the unoptimized memory access is encountered first, hardware simulation 12 proceeds until the completion of the current bus cycle. On the other hand, if software simulation 18 stops because it has proceeded by the first predetermined quantity of clock cycles 24, hardware simulation 12 proceeds for a second predetermined quantity of clock cycles 26. In either case, when hardware simulation 12 stops, software simulation 18 resets its internal clock cycle count 24 and proceeds with instruction execution until one of two conditions is encountered again.

Figure 2:
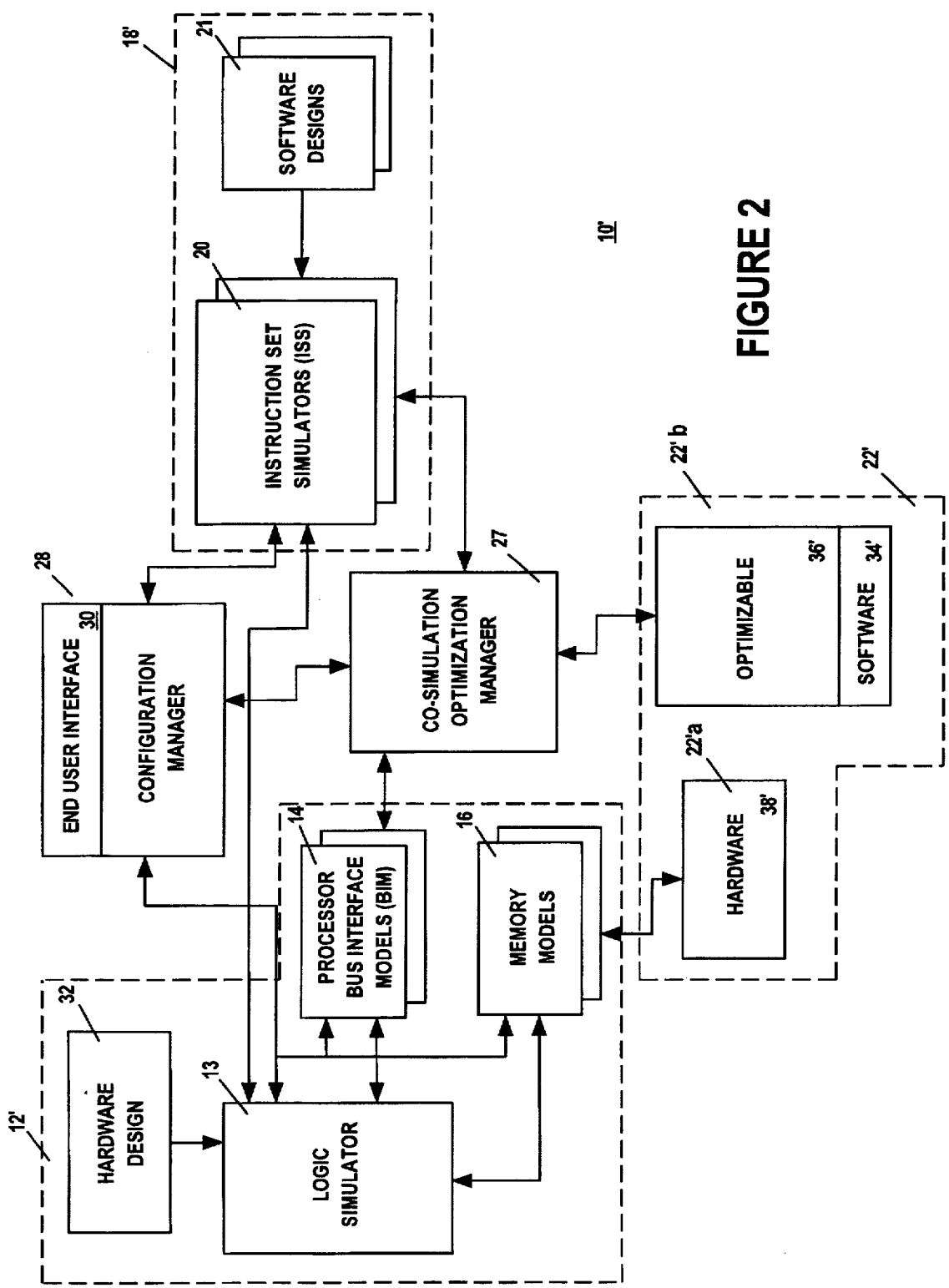
FIG. 2 illustrates one embodiment of the present invention.

FIG. 2 illustrates one embodiment of a hardware-software co-simulator 10' incorporated with the teachings of the present invention. As shown, for the illustrated embodiment, hardware-software simulator 10' includes logic simulator 13, bus interface models 14, and memory models 16. Bus interface models 14 perform their conventional functions of processor modeling. Preferably, bus interface models 14 include models for all major off-the-shelf processors for embedded systems, such as Intel Corporation's 80486 microprocessors, and Motorola Corporation's 68030. Except for the manner processor instances instantiated from bus interface models 14 cooperate with other elements of the present invention, which will be described in more detail below, implementation of bus interface models 14 are known to those skilled in the art, thus will not be otherwise further described.

Memory models 16 model memory of various types. Memory models 16 include memory models for dynamic random access memory (RAM), static RAM, registers, and FIFOs. Preferably, memory models 16 are parameterized, allowing user specification of addresses, data bus widths, access delays, unknown state (X-state) handling, and initialized data values. As will be described in more detail below, memory instances instantiated from memory models 16 are mapped into the address space of an ISS 20 associated with a bus interface model instance 14 to facilitate maintenance of a single coherent view 22 of the memory of the hardware-software system being co-simulated. Similarly, except for the manner in which memory instances instantiated from memory models 16 cooperate with other elements of the present invention, implementation of memory models 16 are well within the ability of those skilled in the art, accordingly memory models 16 will not be otherwise further described either.

Logic simulator 13 performs the conventional function of reading custom user hardware designs 32 and providing overall control to hardware simulation 12'. Except for the teachings incorporated, and the manner logic simulator 13 is used, which will be described in more detail below, logic simulator 13 is intended to represent a broad category of logic simulators known in the art, including but not limited to QuickHDL manufactured by Mentor Graphics Corporation of Wilsonville, Oreg., assignee of the present invention. Thus, logic simulator 13 will not be otherwise further described also.

Additionally, for the illustrated embodiment, hardware-software co-simulator 10' includes a number of ISS' 20. ISS' 20 simulate instruction execution of software design 23 for various processors. ISS' 20 include in particular a number of memory access libraries (not shown) for calling co-simulation optimization manager 27 to perform memory accesses. Except for the teachings incorporated and the manner ISS' 20 are used, which will be described in more detail below, ISS' 20 are intended to represent a broad category of logic simulators known in the art, including but not limited to the X-RAY simulator manufactured by Microtec Research Inc. of Santa Clara, Calif., now a subsidiary of Mentor Graphics, Inc. Thus, ISS' 20 will not be otherwise further described also.

More importantly, for the illustrated embodiment, hardware-software co-simulation 10' includes co-simulation optimization manager 27. Co-simulation optimization manager 27 maintains the single coherent view 22 of the memory of the hardware-software system being co-simulated, including in particular, forwarding unoptimized memory accesses to processor instances 14, and handling optimized memory accesses directly. Co-simulation optimization manager 27 also ensures the desire clock cycle ratio between hardware and software simulations 12 and 18 is maintained. Co-simulation optimization manager 27 will be described in more detail below.

As shown, for the illustrated embodiment, memory segment 38' configured for hardware simulation only is implemented in a first memory file 22a, whereas memory segments 34 and 36 configured for software simulation only, and optimizable, are implemented in a second memory file 22b.

Preferably, as shown for the illustrated embodiment, hardware-software co-simulator 10' further includes configuration manager 28 including end user interface 30 for a user to configure hardware-software co-simulator 10' for co-simulation. The configuration includes associating a processor instance instantiated from one of the bus interface models 14 with an ISS 20, establishing communication connection between the processor instance and the associated ISS 20, establishing the coherent view of memory 22, establishing optimized memory access address ranges, and establishing the desired simulation clock cycle ratio. The first three of these configurations are performed statically, and the last two may be performed statically and/or dynamically. Configuration manager 28 will be described in more detail below.

For ease of understanding, the present invention will be further described in the context of this embodiment. But before we proceed to describe logic simulator 13, processor instance 14, memory model instances 16, ISS 20, co-simulation optimization manager 27 and configuration manager 28 in further detail, it should be noted that the present invention may be practiced in one or more general or special purpose computer systems. It should be noted also, in lieu of ISS 20 and software designs 23, the present invention may be practiced with compiled executable code linked with memory access library routines similar to those provided to ISS 20 for calling co-simulation optimization manager 27.

Figure 3:
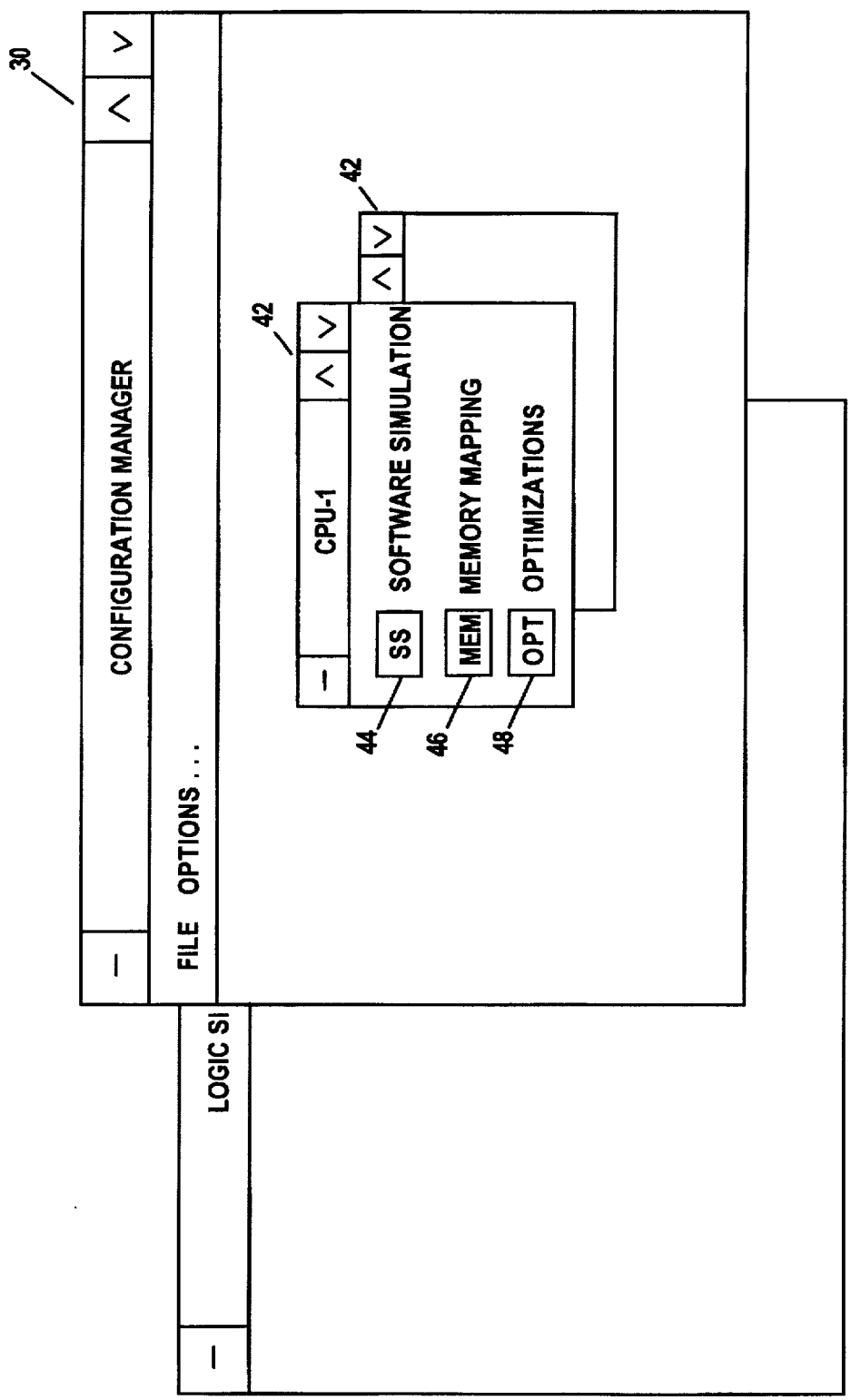
FIG. 3 illustrates an exemplary screen of the end user interface of the configuration manager.

FIG. 3 illustrates an exemplary screen of end user interface 30 of configuration manager 28. As shown, end user interface 30 includes a number of windows 42, organized by processor, through which a user can configure co-simulation parameters for the processor instances. Each window 42 includes exemplary command buttons 44–48 for invoking additional "pop-up" windows through which the user can associate an ISS 20 with the processor instance (button 44), establish a coherent memory view (button 46), and establish address ranges for optimized memory accesses and a desired clock cycle ratio between hardware and software simulation (button 48).

These exemplary windows shown are for illustrative purpose only. Those skilled in the art will recognize that the present invention may be practiced with a variety of end user interfaces, as long as collectively they offer the equivalent ability to configure the essential aspect of co-simulation under the present invention.

Not shown in FIG. 3, is a window through which the user invokes logic simulator 13. As will be described in more detail below, upon invocation, logic simulator 13 instantiates bus interface models 14 and memory models 16. These processor and memory instances in turn register themselves with configuration manager 28. Configuration manager 28 in turn presents the user with the illustrated screen, organized by processor instance, allowing the user to proceed to configure for co-simulation.

Upon selection of the software simulator (SS) button 44, configuration manager 28 presents the user with a list of ISS 20 to select, and associate with the processor instance. Each ISS 20 registers itself with configuration manager 28 upon invocation.

Upon selection of the memory (MEM) button 46, configuration manager 28 presents the user with a graphical representation of a memory map, against which the user can partition into segments, and designate the segments as software simulator only, hardware simulator only, optimizable or unused, as previously illustrated in FIG. 1. The user is also presented with a graphical representation of memory instances, against which the user can map them into the associated ISS's address space.

Upon selection of the optimization (OPT) button 48, configuration manager 28 presents the user with a graphical representation of the optimizable memory segment, against which the user can partition into address ranges, and designate selected ones for optimized memory accesses. For the illustrated embodiment, the configuration manager 28 also presents the user with a mechanism to implicitly designate certain address ranges for optimized memory accesses. In particular, configuration manager 28 allows the user to designate an entire class of bus cycles, e.g. instruction fetches, to be optimized memory accesses (since once performed, hardware simulation of instruction fetches rarely generate any interesting information). [Note that this is a significant speed up to the co-simulation process, since all instructions executed, at one time or another have to be "fetched".] Preferably, configuration manager 28 further allows other classes of operations, e.g. all read operations, to be designated for optimized memory accesses.

Figure 4:
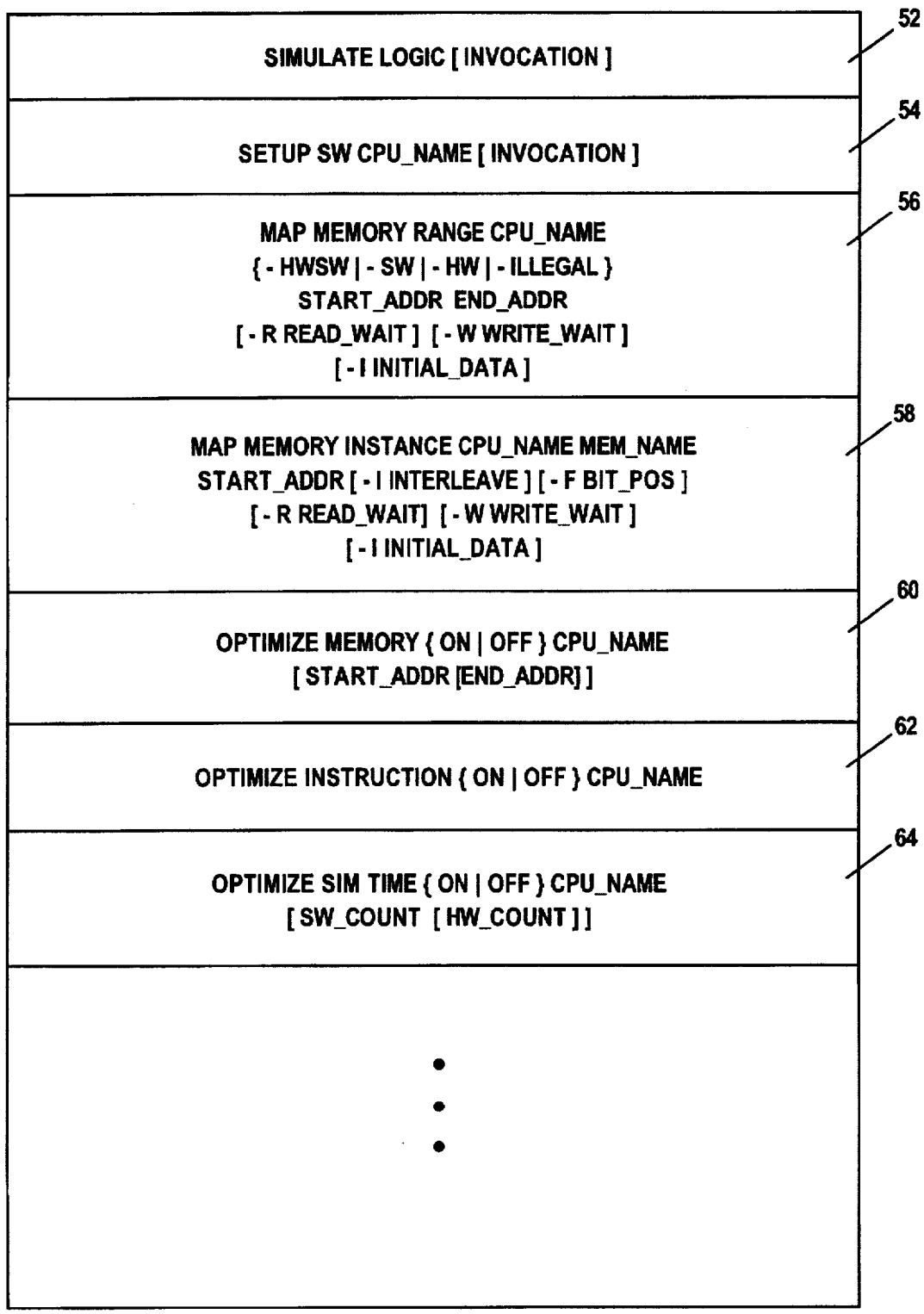
FIG. 4 illustrates the configuration operations in a command line interface format.

FIG. 4 illustrates these configuration/operations in a command line interface format. A user uses the "simulate logic" function 52 to start logic simulator 13. The string "invocation" inside the square brackets denotes conventional start-up commands used to invoke logic simulator 13. A user uses the "setup sw" function 54 to associate an ISS 20 with a processor instance. CPU_Name denotes the processor instance, whereas the string "invocation" inside the square brackets denotes the conventional start-up commands used to invoke ISS 20.

The "map memory range" function 56 allows the user to map a particular memory segment to be either optimizable, software simulator only, hardware simulator only or illegal. CPU_Name denotes the processor instance (thus implicitly specifying the ISS 20). Start_Addr and End_Addr denote the beginning and ending addresses of the memory segment. For memory segments against which optimized memory accesses can be made, the user may further specify Read_Wait, Write_Wait, and Initial_Data to designate the number of "wait states" associated with memory reads and writes, and the default values for unitialized data.

The "map memory instance" function 56 allows the user to map a particular memory instance into the ISS's address space. CPU_Name denotes the processor instance (thus implicitly specifying the ISS 20). Mem_Name identifies the memory instance. Start_Addr denotes the beginning address for mapping the memory instance. The user may further specify whether the memory mapping is to be interleaved. For example, a memory instance may be mapped with Start_Addr of 0 and interleave of 4. In such case, address 0 will be mapped to location 0, address 4 will be mapped to location 1, address 8 will be mapped to location 2 and so on. Presumably, there will be three other memory instances mapped with Start_Addr of 1, 2, 3 respectively, and interleave of 4 to cover the other intervening addresses. Similarly, a user may further specify Read_Wait, Write_Wait, and Initial_Data for the number of "wait states" associated with memory reads and writes, and the default values for unitialized data.

The "optimize memory" function 60 is used to turn optimized memory access on and off for a processor instance (denoted by CPU_Name). For the illustrated embodiment, the default is ON. Furthermore, for the illustrated embodiment, optimized memory accesses may be turned on and off for a subset of the optimizable memory segment, by way of the Start_Addr and End_Addr. For the illustrated embodiment, the "optimize instruction" function 64 is used to turn optimized memory access on or off for all instruction fetches for a processor instance (denoted by CPU_Name). For the illustrated embodiment, the "optimize simulation time" function 64 is used to turn hardware/software simulation clock cycle ratio monitoring on and off for a processor instance (denoted by CPU_Name). SW_Count denotes the maximum amount of clock cycles software simulation may advance before allowing the hardware simulation to advance. HW_Count denotes the maximum amount of clock cycles hardware simulation may advance without letting the software simulation make any advances. If SW_Count is specified without HW_Count, a small default value is employed for HW_Count (in one embodiment, one clock cycle).

Figure 5:
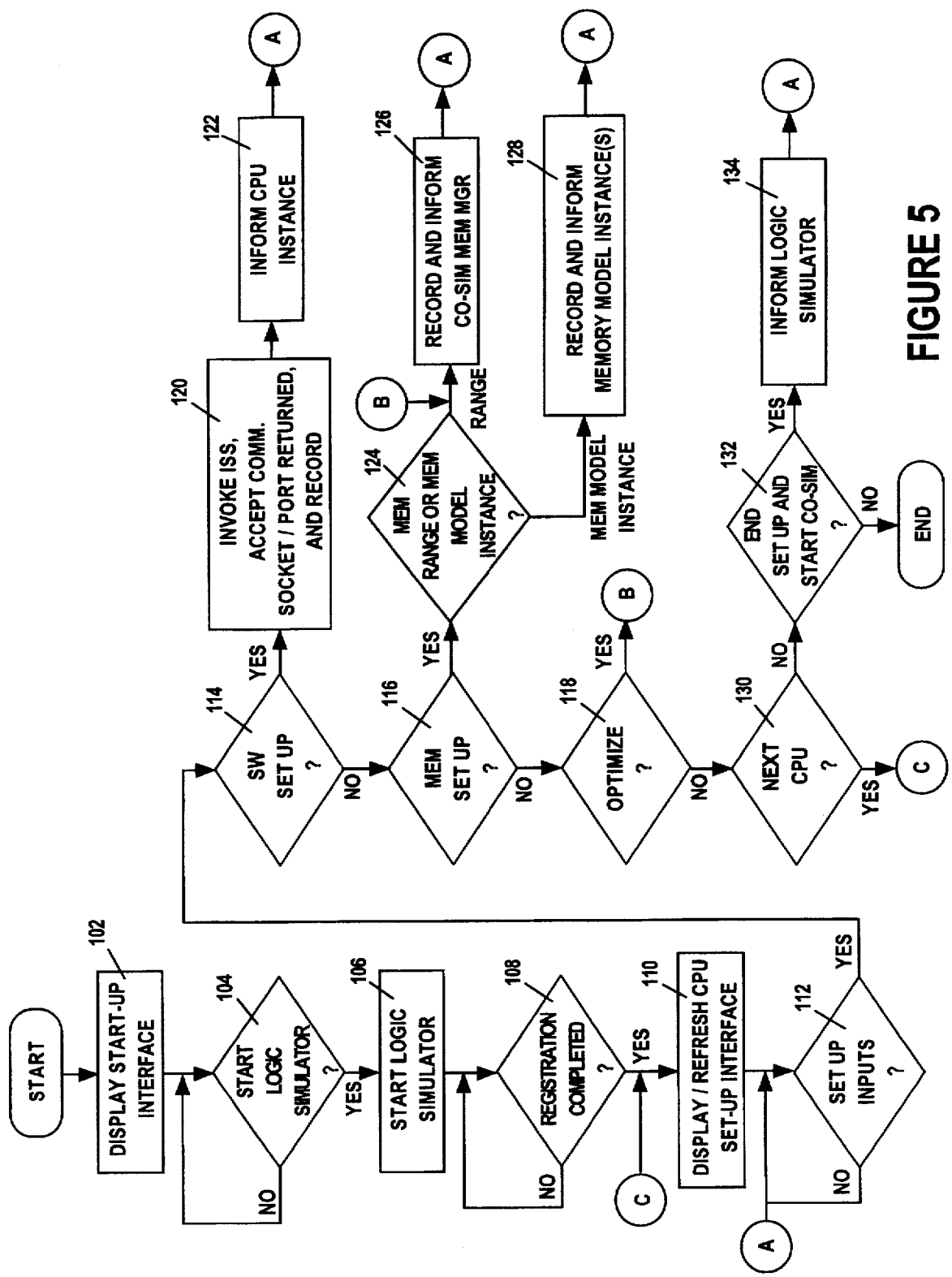
FIG. 5 illustrates one embodiment of the operational flow of the configuration manager.

FIG. 5 illustrates one embodiment of the operational flow of configuration manager 28. As shown, upon invocation, configuration manager 28 displays the "start up" interface for starting up logic simulator 13, step 102. Configuration manager 28 waits for the start up instructions from the user, step 104. Once provided, configuration manager 28 starts up logic simulator 13 as specified, step 106. As described earlier, upon invocation, logic simulator 13 instantiates its bus interface models 14' and memory models 16. Upon instantiation, processor instances and memory instances register their existence with configuration manager 28. Thus, upon starting logic simulator 13, configuration managers 28 registers the various processor instances and memory instances, until all instances have been registered, step 108.

Once having registered all the instances, configuration manager 28 displays/refreshes the processor instance set up interface, step 110. Configuration manager 28 then waits for the set up inputs, step 112. Once received, configuration manager 28 determines whether the set up instructions are for associating an ISS 20, step 114, for establishing a coherent memory view, step 116, or for establishing optimized co-simulation, step 118.

When the user associates an ISS 20 with the processor instance, configuration manager 28 invokes the ISS 20, which in response provides a communication socket/port address for communicating with the ISS 20. Configuration manager 28 logs the information, step 120, as well as forwards the information to the processor instance, step 122. Configuration manager 28 also creates a shared memory file and provides a pointer to the shared memory file to the ISS 20 and the co-simulation optimization manager 27.

If the user wants to establish a coherent memory view, step 116, configuration manager 28 presents either the user interface for mapping memory segment or the user interface for mapping memory instances, step 124. For mapping memory segment, configuration manager 28 logs the information and notifies co-simulation optimization manager 27, step 126. For mapping memory instances, configuration manager 28 logs the information and notifies the memory instances accordingly, step 126.

If received set up inputs are not intended for one of these operations, configuration manager 28 further determines whether the user wants to configure another processor instance or end configuration, step 130. If the user wants to configure another processor instance, configuration manager 28 displays/refreshes the processor set up interface, step 110, and continues operation as described earlier. On the other hand, if the user has completed configuration, configuration manager 28 further determines if the user wants to start co-simulation at this time, step 132. If the determination is affirmative, configuration manager 28 notifies logic simulator 13 to start co-simulation, and returns to step 112, otherwise configuration manager 28 ends the configuration session. For the illustrated embodiment, certain aspects of co-simulation configuration, such as optimized memory access address ranges and the desired clock cycle ratio between hardware and software simulations may be reconfigured, while the co-simulation is in progress.

Figure 6:
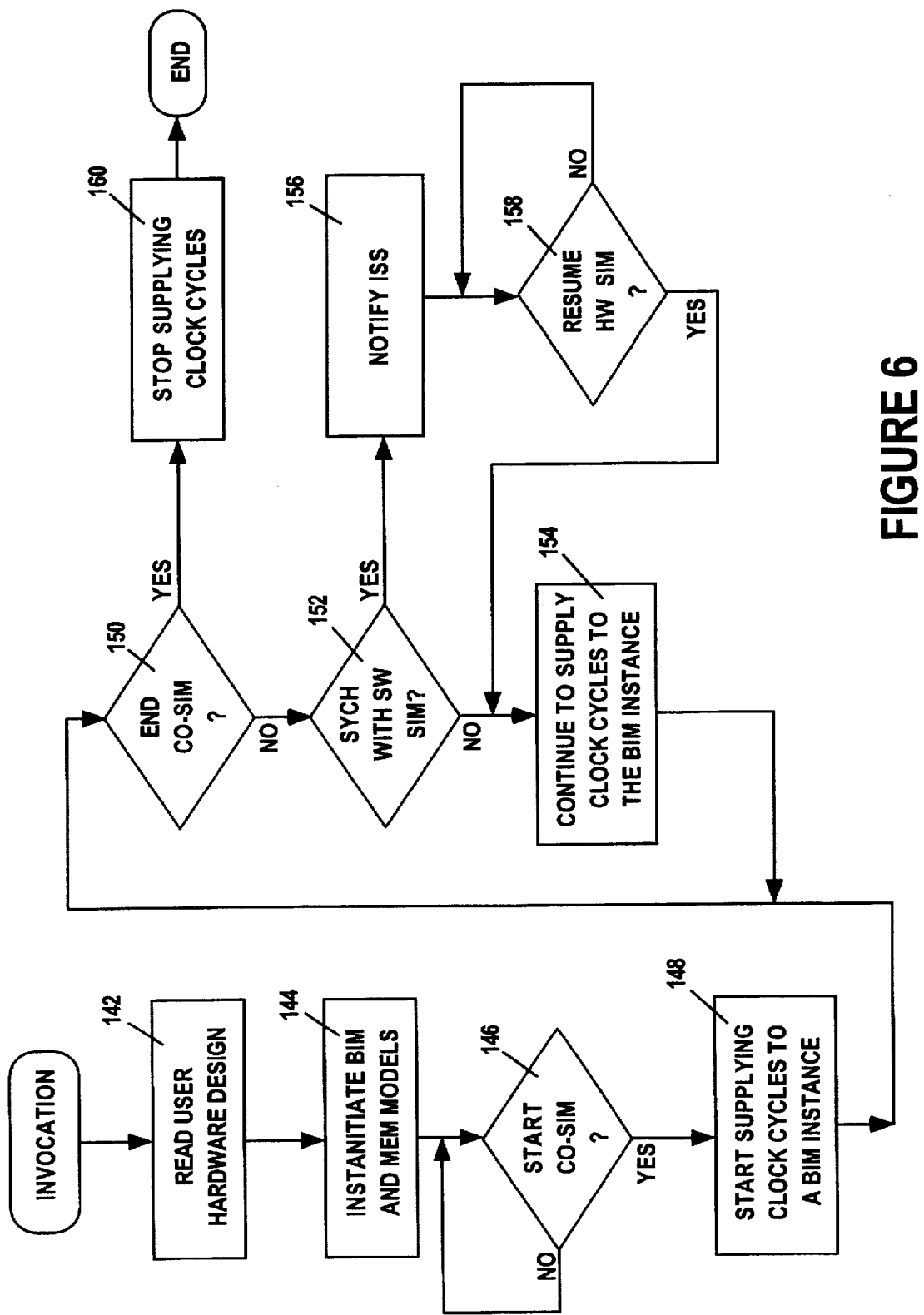
FIGS. 6–8 illustrate one embodiment each of the operational flow of the logic simulator, a typical processor instance, and a typical memory instance.

FIG. 6 illustrates one embodiment of the operational flow of logic simulator 13. As discussed earlier, upon invocation, logic simulator 13 reads the user's hardware design, step 142. Next, logic simulator 13 instantiates bus interface models 14 and memory models 16, step 144. Logic simulator 13 then waits for notification from configuration manager 28 to start co-simulation, step 146. Upon receipt of notification, logic simulator 13 starts supplying clock cycles to a processor instance, step 148. While supplying clock cycles to the processor instance, logic simulator 13 monitors for events that denote end of co-simulation, step 150, or synchronization with software simulation, step 152. If none of these events is detected, logic simulator 13 continues to supply clock cycles to the processor instance, step 154. On the other hand, if an event denoting synchronization with software simulation is detected at step 152, logic simulator 13 stops supplying clock cycles to the processor instance and notifies the associates ISS 20, step 156. Logic simulator 13 then waits for notification from ISS 20 that hardware simulation should resume, step 158. Upon being so notified, logic simulator 13 resumes supplying clock cycles to processor instance again, step 154. Eventually, an event for ending co-simulation will be detected at step 150. At such time, logic simulator 13 stops supplying clock cycles to processor instance, and ends co-simulation, step 160.

If the co-simulation is not configured with optimized simulation time (i.e. desired clock cycle ratio) nor optimized memory accesses, logic simulator 13 and ISS 20 coordinate to synchronize hardware and software simulation in a conventional manner, i.e. at least at each instruction boundary or earlier, depending on the granularity of simulation of ISS 20. If the co-simulation is not configured with optimized simulation time, but configured with optimized memory accesses, hardware simulation does advance when an optimized memory access is encountered, the optimized memory access is performed by ISS 20 by making a direct access to the shared memory file, by-passing the processor instance.

The processor instance goes through the logic of acquiring the bus, holds the bus and advances the hardware simulation a number of clock cycles, as defined by the number of "wait states" entered by the user, plus a number of clock cycles required to transfer the data across the bus (i.e. the zero wait state timing for the memory model for the particular design). At the end of this time, the bus is release. Normally, during this time, the data would be transferred across the bus in the logic simulator. In this case, the bus is idles. By acquiring the bus and holding it the bus interface model ensures that the peripheral components on the bus cannot advance state of the hardware simulation during this artificial idle time on the bus. This set of steps ensures that the hardware and software simulations remain synchronized.

If the co-simulation is configured with optimized simulation time without specifying SW_Count and HW_Count, software simulation proceeds until an unoptimized memory access is encountered. At such time, hardware simulation is allowed to advance until the unoptimized memory access is completed. Note that if the co-simulation is not configured with any optimized memory access address ranges, then every memory access encountered is an unoptimized memory access.

If the co-simulation is configured with optimized simulation time and SW_Count is specified, software simulation proceeds until either an unoptimized memory access is encountered or until software simulation has advanced by SW_Count. In the first case, hardware simulation is allowed to advance until the unoptimized memory access is completed. In the second case, hardware simulation is allowed to proceed until it has advanced by HW_Count, if specified, or by a default amount, if HW_Count is not specified. Again, if the co-simulation is not configured with any optimized memory access address ranges, then every memory access encountered is an unoptimized memory access.

Figure 7:
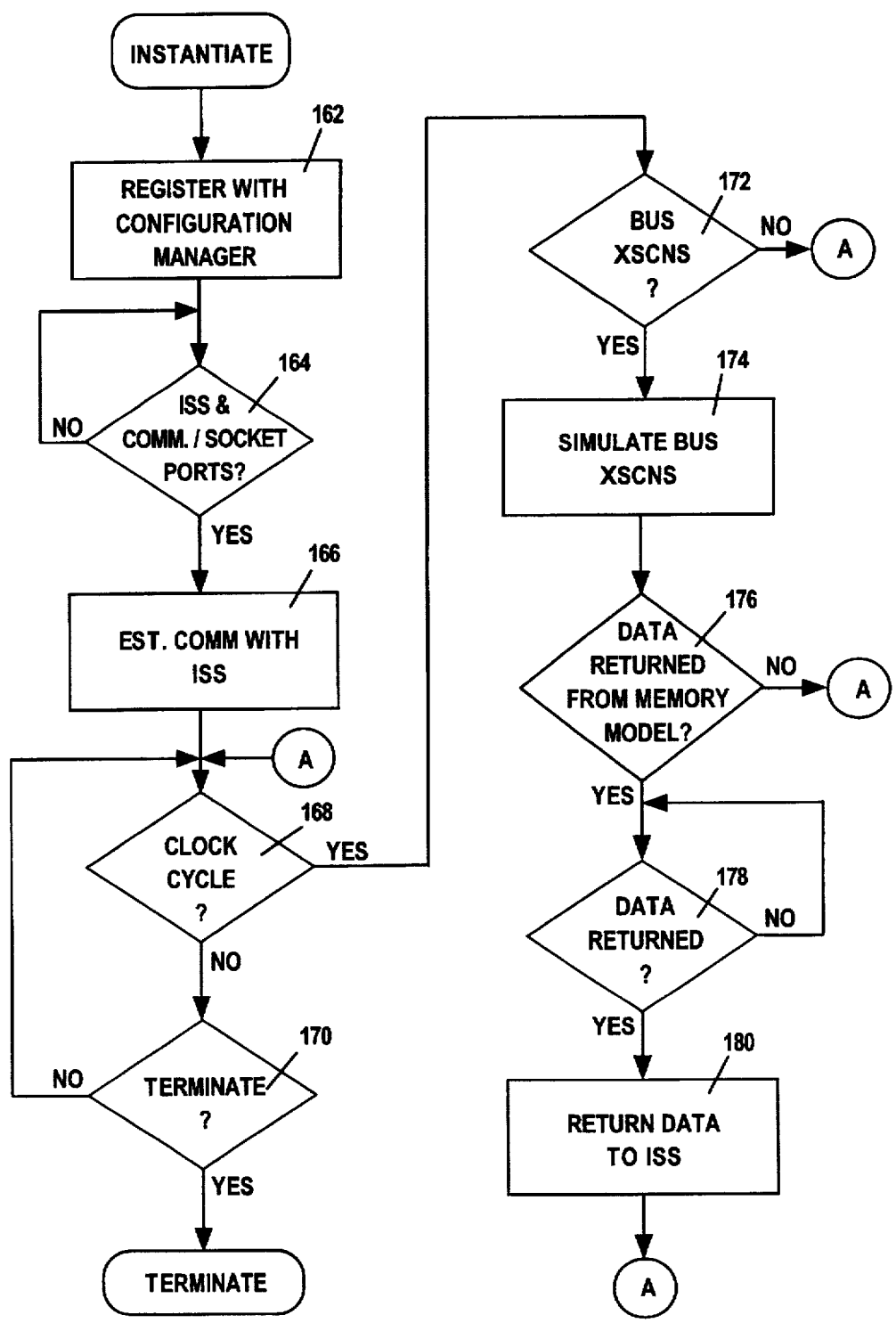

FIG. 7 illustrates one embodiment of the operational flow of a typical processor instance instantiated from a bus interface model 14'. As shown, upon instantiation, processor instance registers itself with configuration manager 28, step 162. Upon registration, processor instance waits for the associated ISS' identification and its communication socket/port address from configuration manager 28, step 164. Upon receipt of both the ISS' identification and its communication socket/port address, processor instance establishes connection with the associated ISS at the provided socket/port address, step 166.

Upon establishing the connection, processor instance waits for a clock cycle from logic simulator 13, step 168. While waiting for a clock cycle, processor instance also monitors for events that denote termination of co-simulation, step 170. Processor instance terminates itself if the co-simulation is being terminated, otherwise, it continues to wait for a clock cycle at step 168. Eventually, processor instance receives a clock cycle at step 168, processor instance then determines whether a bus transaction should be generated, step 172. If no bus transaction is to be generated, processor instance returns to step 168. On the other hand, if a bus transaction is to be generated, processor instance generates the bus transaction accordingly, step 174. Processor instance further determines if the bus transaction is a memory access transaction that will result in data being returned from a memory model instance, step 176. If data will be returned, processor instance waits for the data, step 178, and upon receipt of the data, processor instance returns the data to the associated ISS 20, step 180. Processor instance then proceeds to step 168 and awaits for the next clock cycle.

Figure 8:
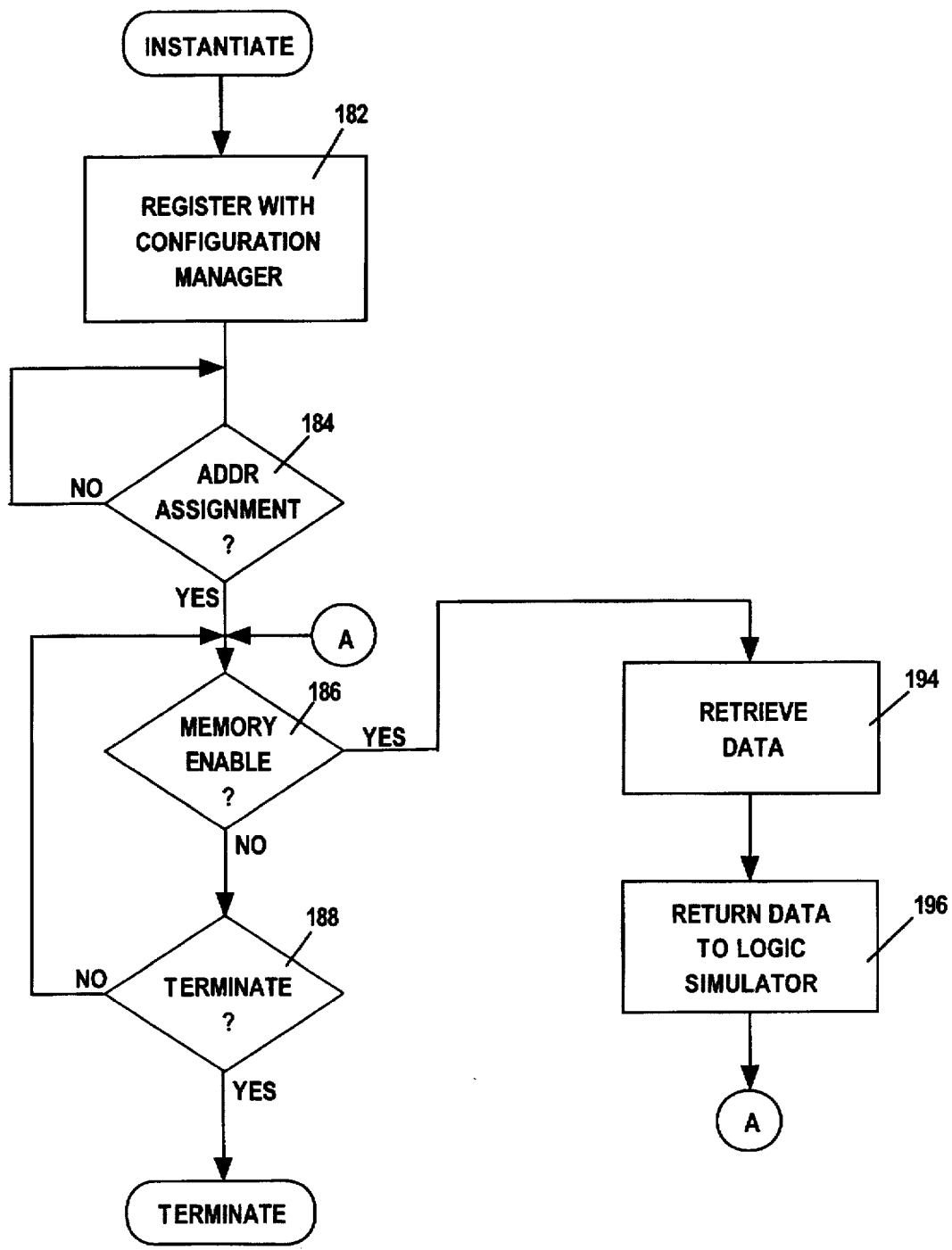

FIG. 8 illustrates one embodiment of the operational flow of a typical memory instance instantiated from one of the memory models 16. As shown, upon instantiation, a memory instance registers itself with configuration manager 28, step 182. Upon registering itself, the memory instance waits for its address assignment and a pointer to the shared memory file from configuration manager 28. Upon receipt of its address assignment and the pointer to the shared memory file, the memory instance then waits for a memory enable indication from logic simulator 13, step 186. While waiting for the memory enable indication, the memory instance also monitors for events that denote termination of co-simulation, step 188. The memory instance terminates itself if the co-simulation is being terminated, otherwise, it continues to wait for the memory enable indication at step 186. Eventually, memory instance receives the memory enable indication at step 186, the memory instance retrieves or stores the data, and returns the status and/or data to logic simulator 13, steps 194 and 196. Upon returning the status and/or data, the memory instance returns to step 186.

Figure 9:
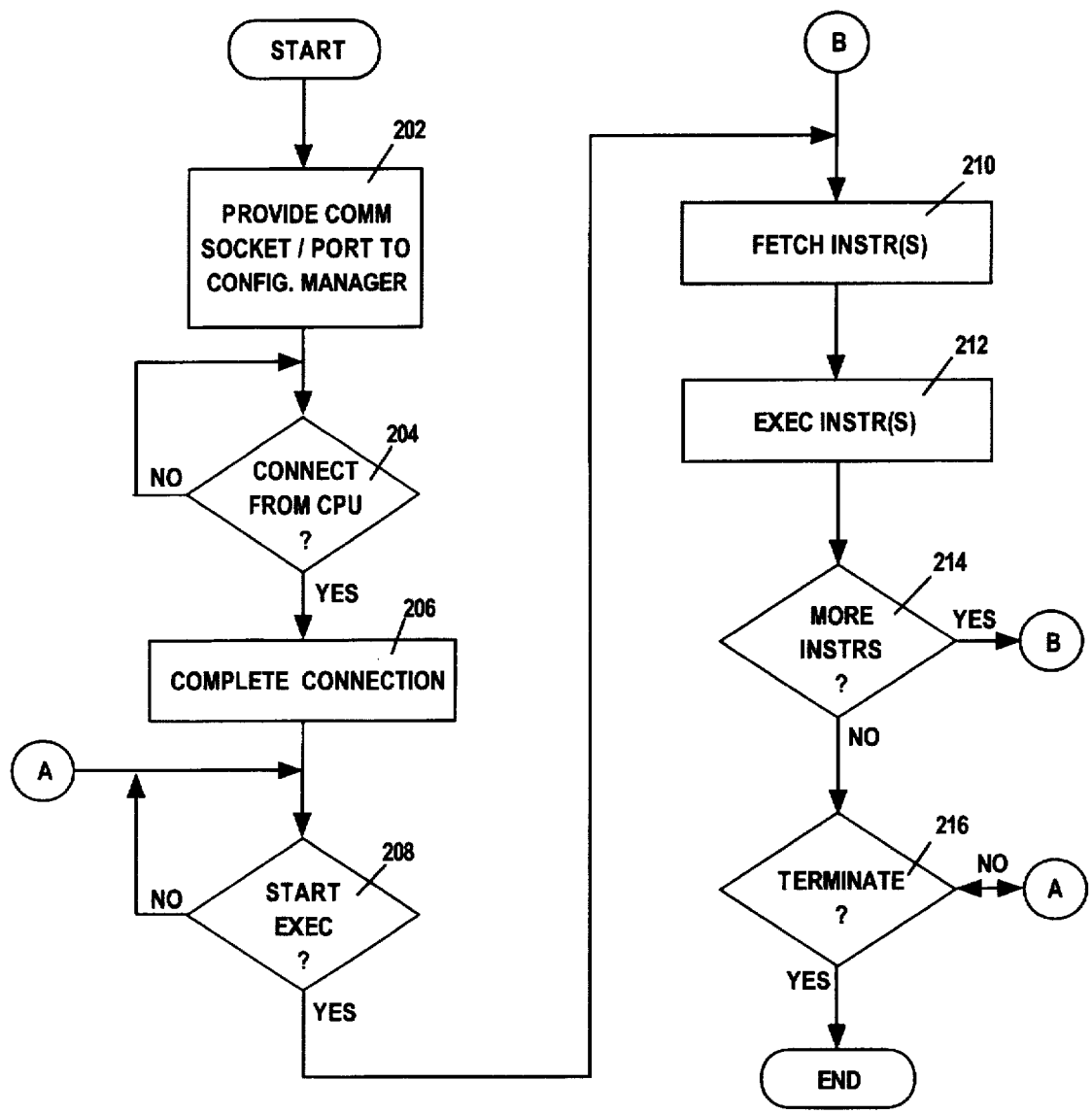
FIGS. 9–10 illustrate one embodiment each of the operational flow of a typical instruction set simulator and a co-simulation optimization manager.

FIG. 9 illustrates one embodiment of the operational flow of a typical ISS 20. As shown, upon invocation, ISS 20 provides configuration manager with its communication socket/port address, step 202. In response, as described earlier, ISS 20 is provided with a pointer to the shared memory file. Then, ISS 20 awaits a connection request from a processor instance, step 204. Upon receipt of such a request, ISS 20 completes the connection, step 206. Next, ISS 20 awaits notification from the connected processor instance to start instruction execution, step 208.

Upon receipt of the starting notification, ISS 20 proceeds to fetch instruction(s) from memory through co-simulation optimization manager 27, step 210. Upon fetching the instruction(s), ISS 20 simulates execution of the instruction (s), step 212. Upon simulated execution of the fetched instruction(s), ISS 20 determines if there are more instructions to execute, step 214. If there are more instructions to execute, ISS 20 returns to step 210. On the other hand, if the determination is negative, ISS 20 further determines whether it should terminates itself, step 216. If the determination is negative[1], ISS 20 returns to step 208 and awaits the "start simulation" notification.

[1] For example, when the exhaustion of instructions was caused by the encountering of a breakpoint, a "stop simulation" interrupt, or other debugging events of like kind.

For ease of understanding, we have described ISS 20 with a traditional operational flow, wherein instructions are fetched and executed in sequence. As will be appreciated by those skilled in the art, the present invention may also be practiced with more sophisticated ISS 20 reflecting pipelined, multi-scalar, and/or out-of-order execution.

Figure 10:
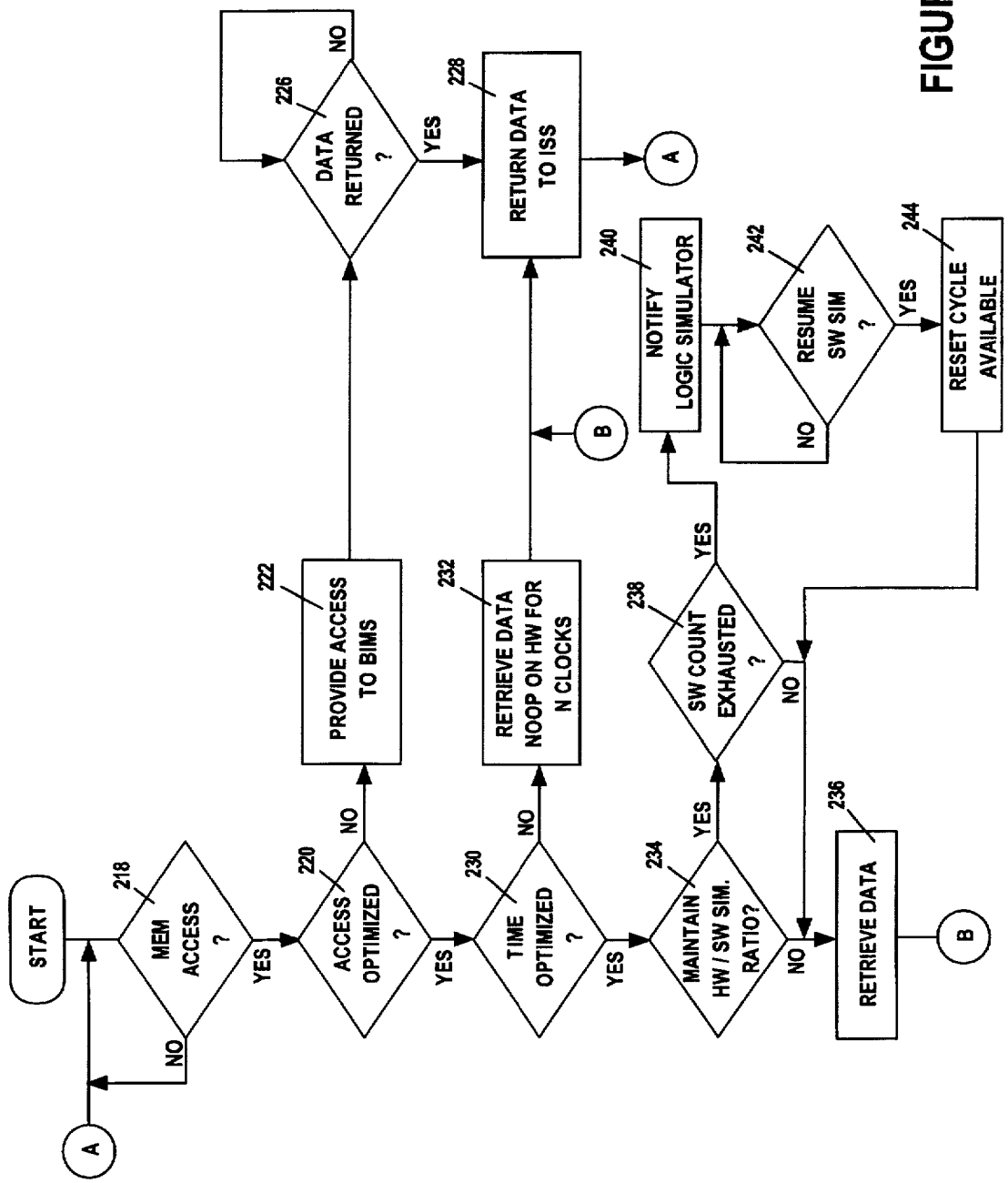

FIG. 10 illustrates one embodiment of the operational flow of co-simulation optimization manager 27. As shown, upon invocation and provided with a pointer to the shared memory file, co-simulation optimization manager 27 waits for memory requests from ISS 20, step 218. Upon receipt of a memory access request, co-simulation optimization manager 27 determines whether co-simulation has been configured to have memory access optimized, step 220. If the determination is negative, co-simulation optimization manager 27 forwards the request to the processor instance, step 222. In response, as described earlier, processor instance then generates the appropriate bus cycles, resulting in the appropriate memory instance retrieving the requested data, and in due course returned to co-simulation optimization manager 27. In the meantime, co-simulation optimization manager 27 awaits the return of the requested data, step 226. Upon receipt of the requested data, co-simulation optimization manager forwards the returned data to ISS 20, step 228.

On the other hand, if it was determined at step 220 that co-simulation was configured to have memory access optimized, co-simulation optimization manager 27 further determines if co-simulation was also configured to have simulation time optimized between hardware and software simulations, step 230. If the determination is negative, co-simulation optimization manager 27 retrieves the requested data directly, by-passing hardware simulation, step 232. In place of the memory request, co-simulation optimization manager 27 generates an appropriate number of no-ops for the hardware simulation. After retrieving the requested data, co-simulation optimization manager 27 returns the requested data to ISS 20, step 228.

On the other hand, if back at step 230, it was determined that the co-simulation is also configured to have simulation time optimized, co-simulation optimization manager 27 further determines if the co-simulation is configured to have a desired clock cycle ratio between hardware and software simulations ensured, step 234. If the determination is negative, co-simulation optimization manager 27 retrieves the requested data, step 236, and returns the retrieved data to ISS 20, step 228. If the determination at step 234 is affirmative, co-simulation optimization manager 27 further determines if the clock cycles for software simulation have been exhausted, step 238. If the determination is negative, co-simulation optimization manager 27 performs steps 236 and 228 as described earlier. If the determination at step 238 is affirmative, co-simulation optimization manager 27 notifies logic simulator 13 to advance hardware simulation, step 240. Then, co-simulation optimization manager 27 awaits notification from logic simulator 13 that software simulation should resume, step 242. Upon receipt of the resumption notification, co-simulation optimization manager 27 resets the amount clock cycles available for software simulation, step 224, and then performs step 236 and 228 as described earlier.

While for ease of explanation, we have described co-simulation optimization manager 27 with an interdependent implementation of memory access optimization and simulation time optimization, however those skilled in the art will appreciate that the present invention may be practiced with independent implementations of memory access optimization and simulation time optimization.

Figure 11:
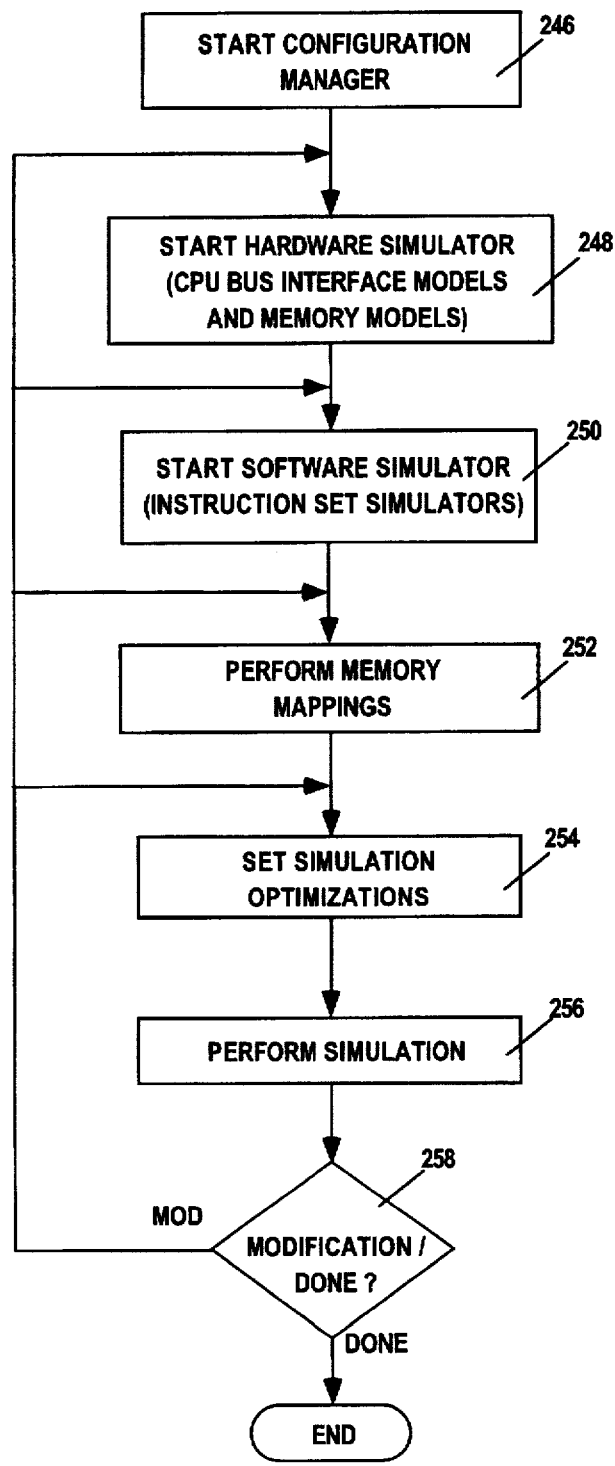
FIG. 11 summarizes the method steps of the present invention from a user's perspective.

FIG. 11 summarizes the method steps of the above described embodiment of the present invention from a user perspective. Initially, a user starts configuration manager 28, step 246. Next, the user starts logic simulator 13, which leads to the instantiation of processor and memory instances and their registrations, step 248. Then, the user associates an ISS 20 with one of the processor instances, implicitly starting an ISS 20 and establishing a communication connection between the processor instance and the associated ISS 20, step 250. The user then characterizes various memory segments, and maps memory instances into the memory segments, step 252. The user further configures optimized memory access address ranges and the desired hardware to software simulation clock cycle ratio, step 254. Finally, the user ends configuration and starts co-simulation, step 256. Actually, the user may defer starting of the co-simulation.

While the co-simulation is in progress (without even having to wait for a "breakpoint"), the user may re-configure one or more of the optimizations. For examples, removing an address range from optimized memory access, adding an address range to optimized memory access, turning optimized simulation time on/off, or increasing/decreasing the number of clock cycles available for software and/or hardware simulations.

Additionally, at the end of a co-simulation run, the user may alter memory characterization and/or mapping, instruction set simulator and processor instance association(s), and re-run the co-simulation. The user may also save the co-simulation results, and return on a subsequent session (in another day) to perform the re-run. As will be appreciated by those skilled in the art, these are merely exemplary scenarios for illustrative purpose, the present invention may be used in numerous other manners.

Figure 12:
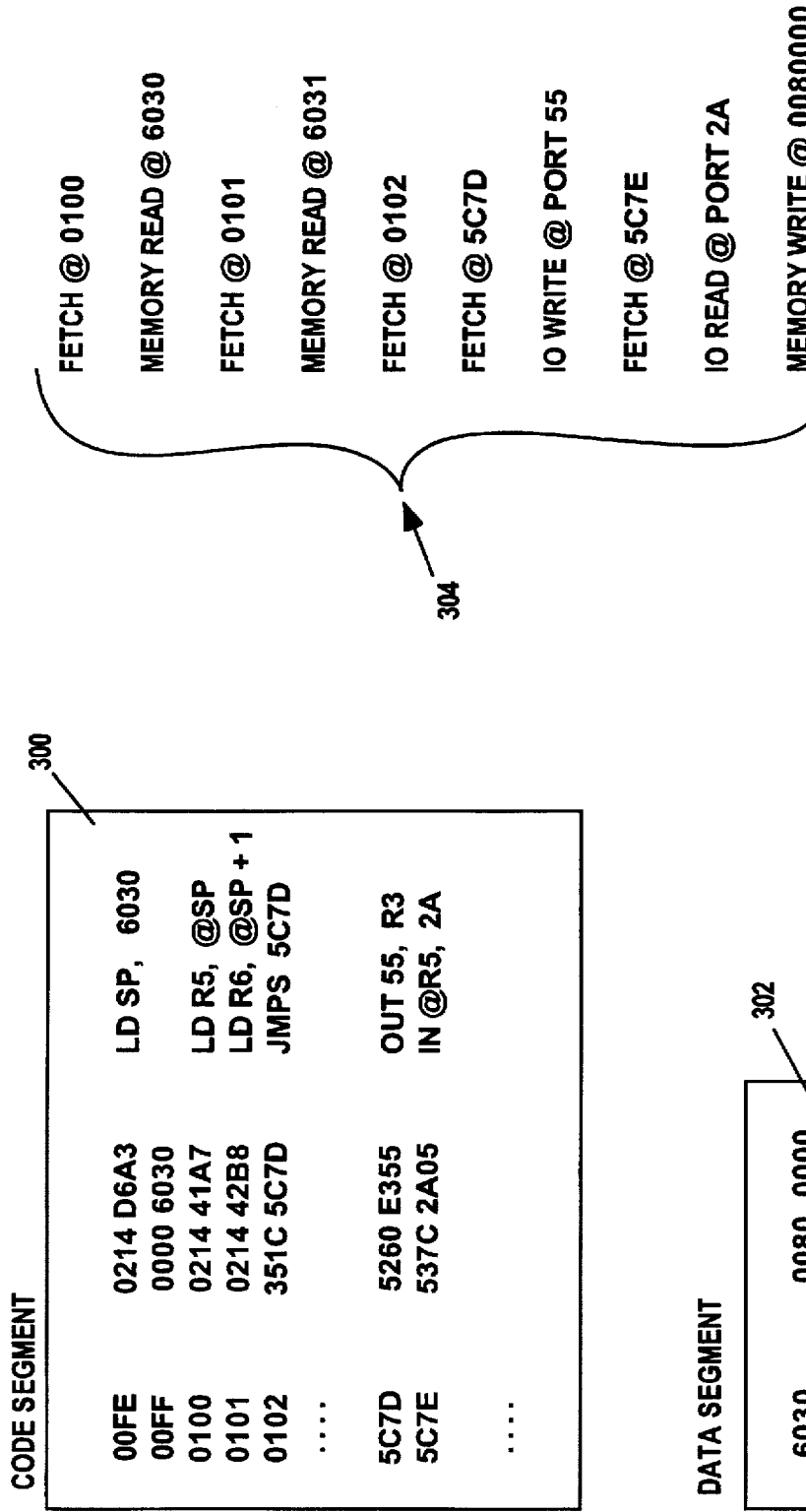
FIGS. 12–19 illustrate a sample application of the present invention to a co-simulation of a hardware-software system.
Figure 13:
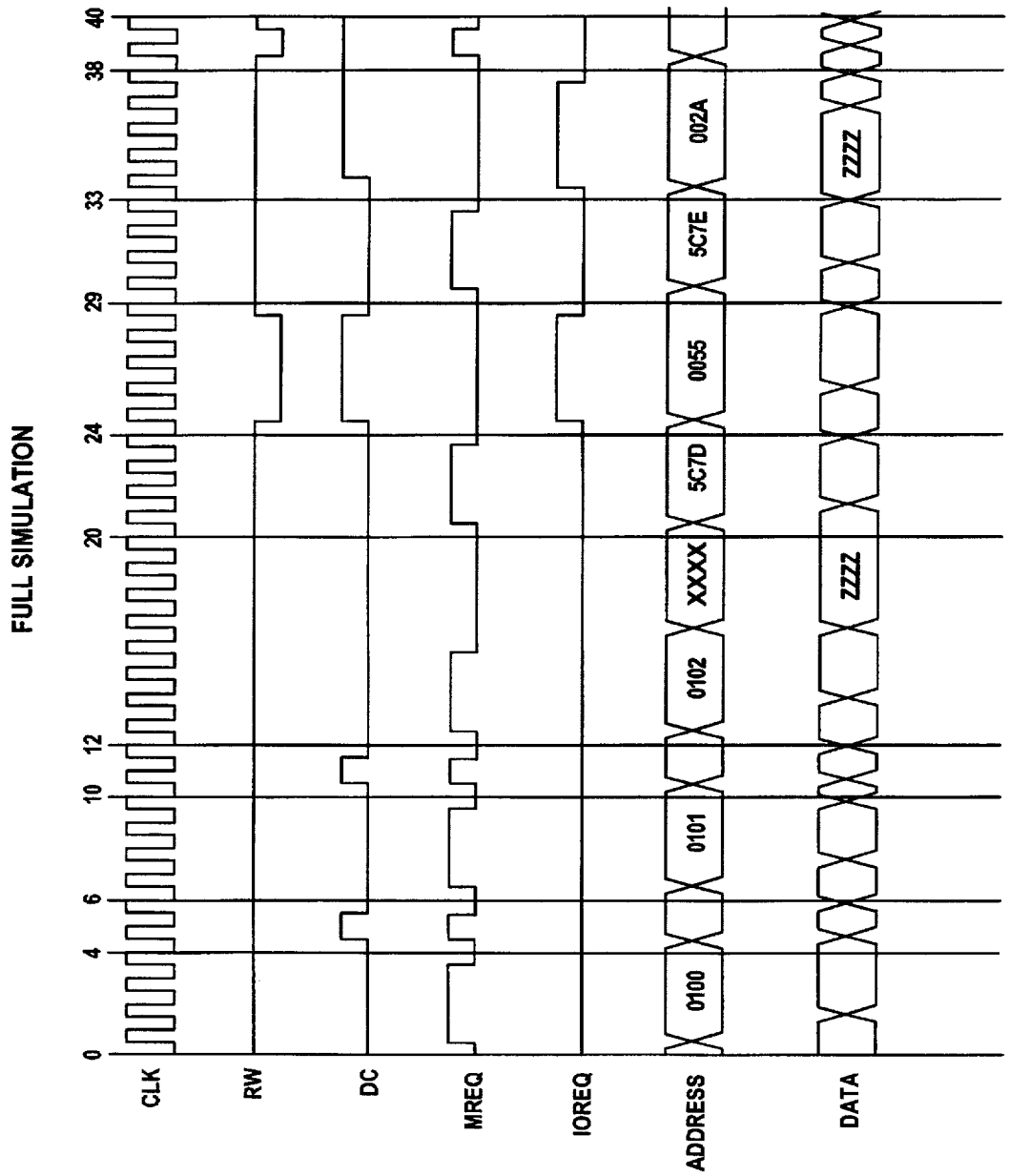
Figure 14:
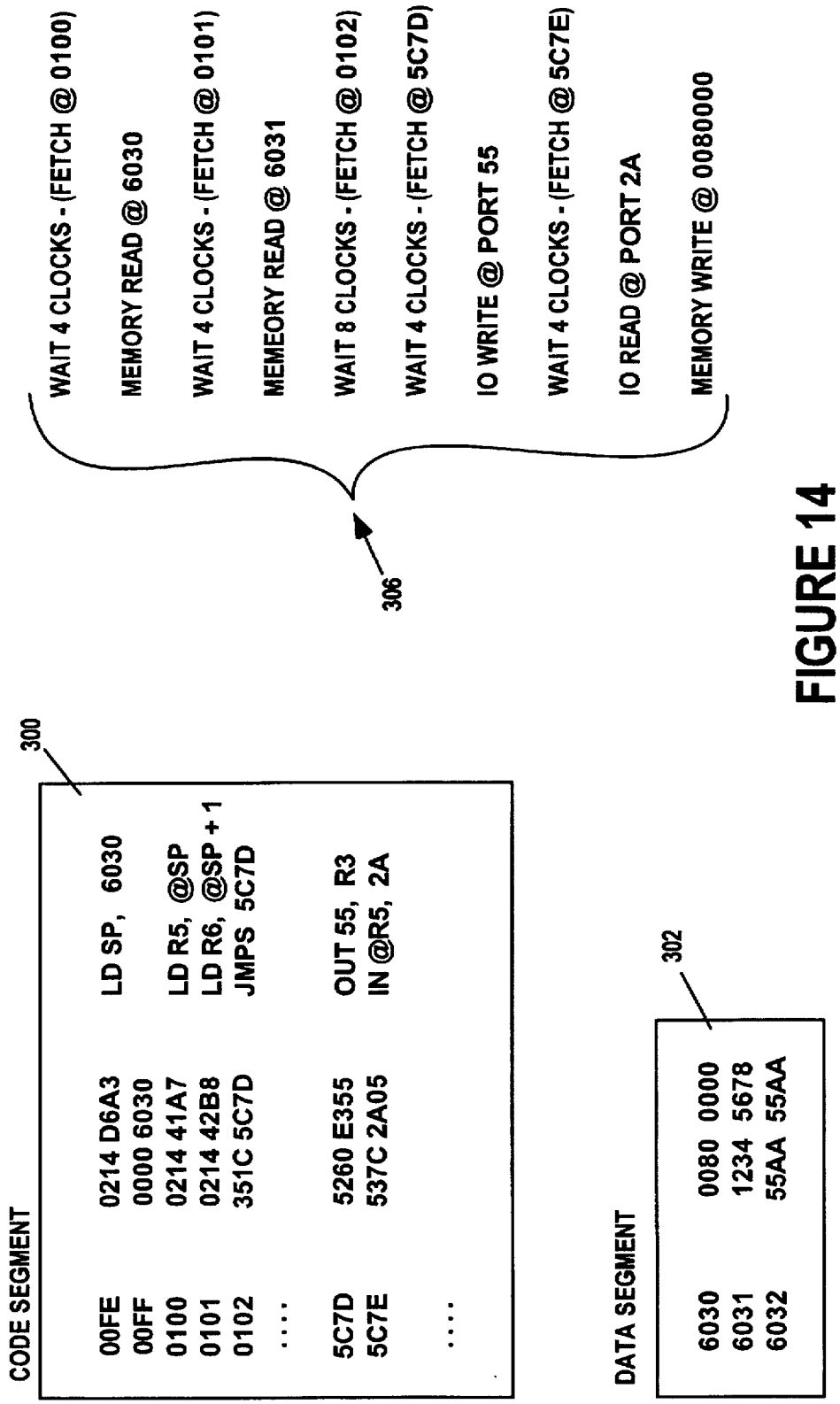
Figure 15:
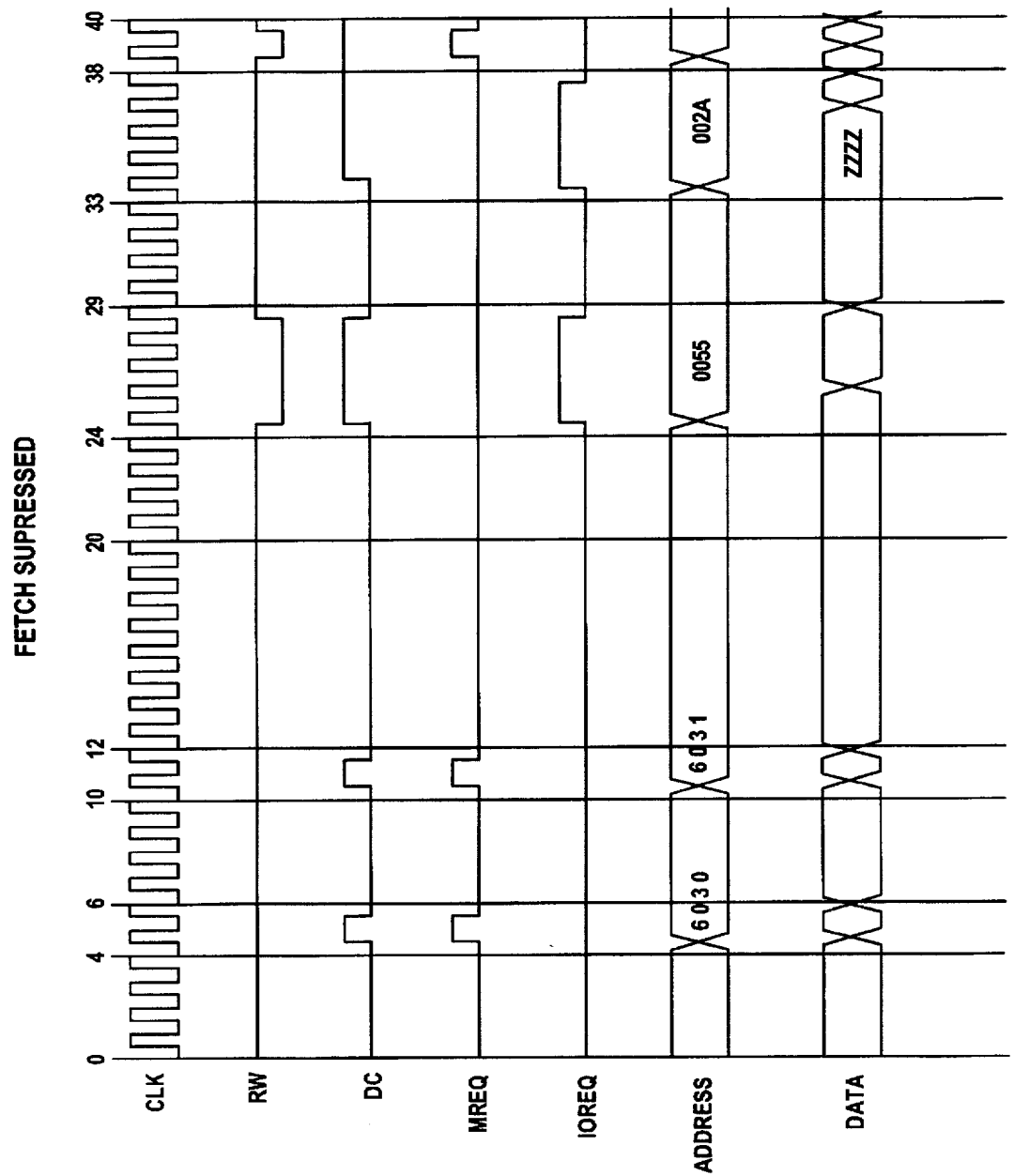

FIGS. 12–19 illustrate a sample application of the present invention to a sample co-simulation of a hardware-software system. As illustrated in FIG. 12, the sample co-simulation includes sample code segment 300 and data segment 302. If the co-simulation is performed without any optimization, the bus cycles driven 304 will include the various fetch, memory read/write, I/O read/write cycles illustrated. FIG. 13 illustrates the states of selected signals, e.g. clock (CLK), memory request (MREQ), ADDRESS and DATA, if the co-simulation is performed without any optimization. FIG. 14 illustrates the bus cycles driven 306 if the co-simulation is performed with optimized instruction fetch, i.e. instruction fetches are performed by co-simulation optimization manager 27 directly, by-passing hardware simulation. Note that a number of wait states are substituted for the fetch bus cycles. Also note that all of the active bus cycles occur at the same simulation times as in the full simulation case. FIG. 15 illustrates the states of the same selected signals, e.g. clock (CLK), memory request (MREQ), ADDRESS and DATA, if the co-simulation is performed with optimized instruction fetch. While the number of clock cycles simulated remain the same, as will be appreciated by those skilled in the art, the elapse simulation time is reduced.

Figure 16:
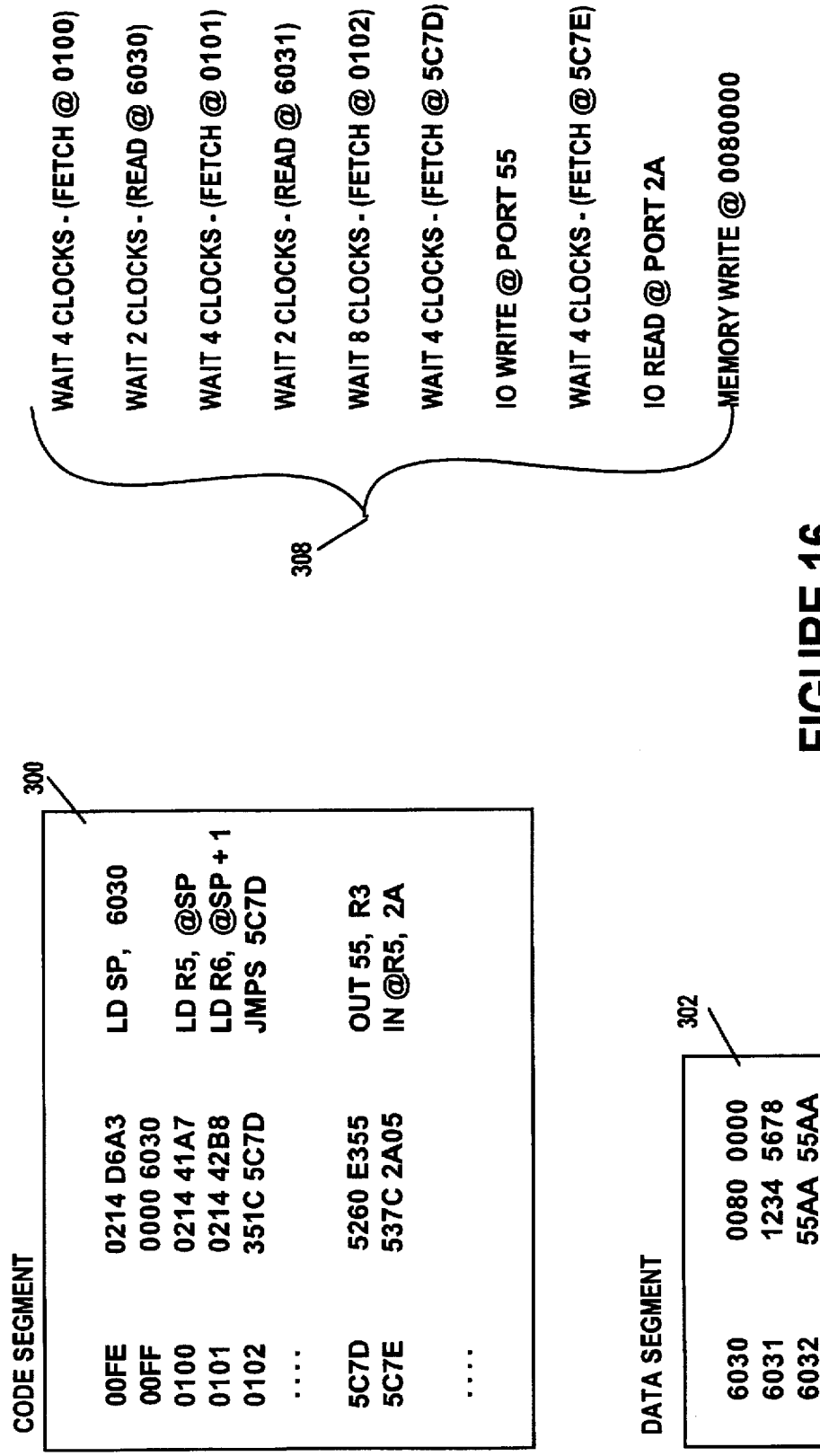
Figure 17:
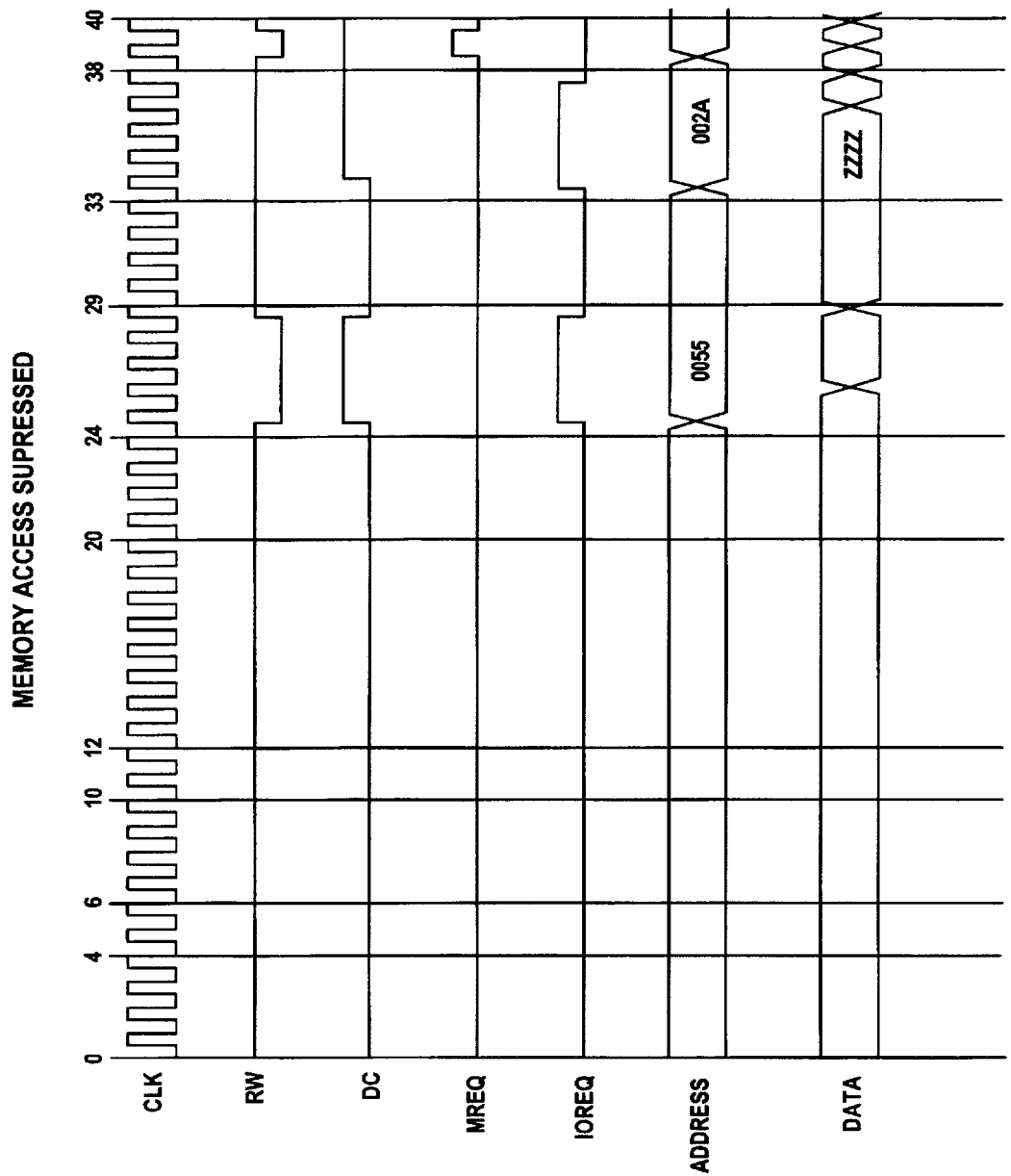

FIG. 16 illustrates the bus cycles driven 308 if the co-simulation is also performed with optimized memory read/write to the address range of data segment 302, i.e. memory read/write to the address range of data segment 302 are performed by co-simulation optimization manager 27 directly, by-passing hardware simulation. Note that a number of wait cycles are also substituted for the memory read/write bus cycles. FIG. 17 illustrates the states of the same selected signals, e.g. clock (CLK), memory request (MREQ), ADDRESS and DATA, if the co-simulation is also performed with optimized memory read/write to the address range of data segment 302. Again, while the number of clock cycles simulated remain the same, as will be appreciated by those skilled in the art, the elapse simulation time is further reduced.

Figure 18:
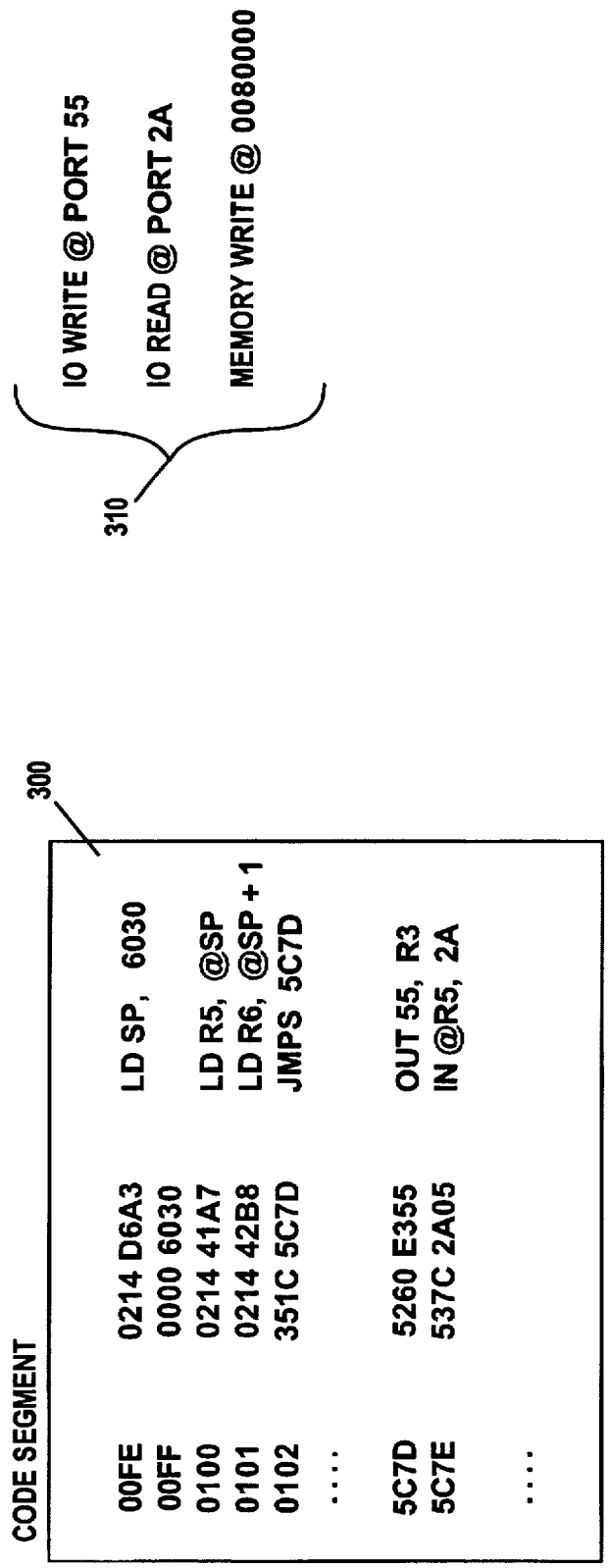
Figure 19:
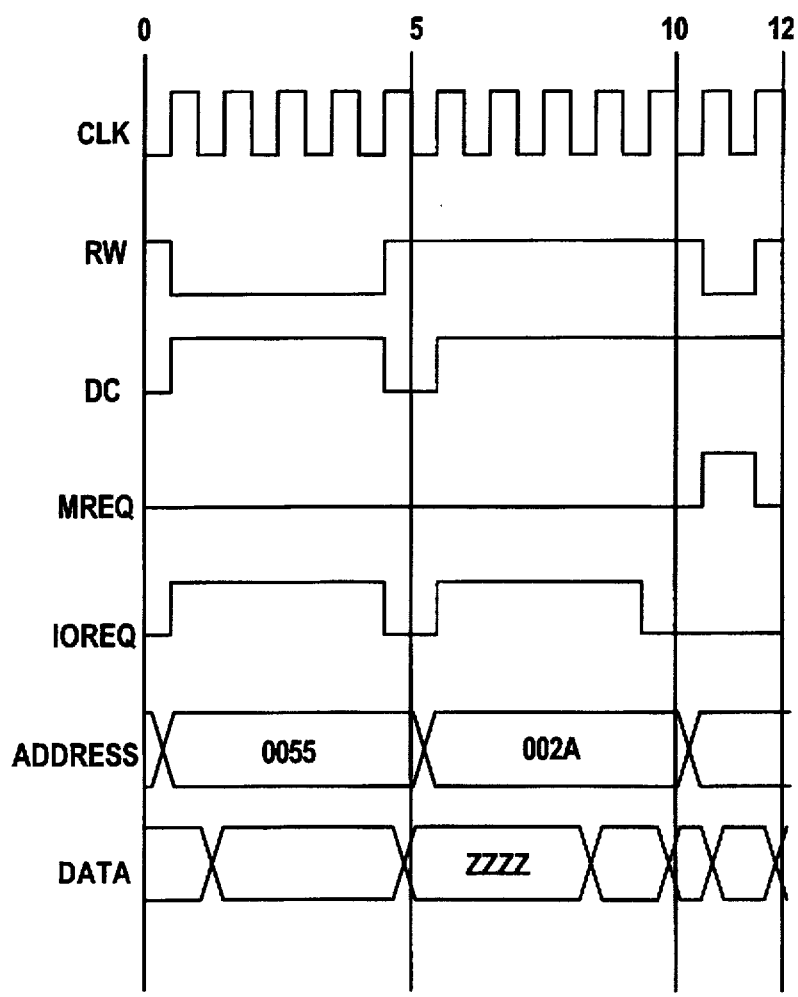

FIG. 18 illustrates the bus cycles driven 310 if the co-simulation is also performed with time optimization, i.e. wait cycles are not generated for optimized accesses. Note that the number of bus cycles driven 310 are significantly smaller. FIG. 19 illustrates the states of the same selected signals, e.g. clock (CLK), memory request (MREQ), ADDRESS and DATA, if the co-simulation is also performed with time optimization. Note that the number of clock cycles simulated has been reduced, resulting in further reduction in elapsed simulation time.

Thus, an optimizing hardware-software co-simulator has been described. While the method and optimizing hardware-software co-simulator of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. In an optimizing hardware-software co-simulator, a method for co-simulating a hardware-software system having memory, the method comprising the steps of:

simulating hardware operations for one or more co-simulation runs with one or more bus interface model instances modeling one or more processors, one or more memory model instances modeling one or more memory types, and a logic simulator controlling the bus interface model instances and the memory model instances;

simulating software execution for said one or more co-simulation runs with one or more software execution environments; and concurrently facilitating by a co-simulation optimization manager, a single coherent view of the memory of the hardware-software system by said simulation of hardware operations and said simulation of software execution during said one or more co-simulation runs, such that selected portions of at least a first memory segment of the memory can be dynamically as well as statically configured/reconfigured for either unoptimized accesses or optimized accesses for all or selected portions of said one or more co-simulation runs, wherein unoptimized accesses are performed through simulated hardware operations, and optimized accesses are performed directly by said co-simulation optimization manager, without simulating hardware operations.

2. The method of claim 1, wherein the method further comprises the step of a configuration manager statically establishing for said one or more co-simulation runs, communication channels for said logic simulator and instruction set simulators of said one or more software execution environments to communicate with each other, in response to user inputs.

3. The method of claim 1, wherein the method further comprises the step of a configuration manager statically associating for said one or more co-simulation runs, bus interface model instances for one or more processors, with instruction set simulators of said one or more software execution environments for the one or more processors, in response to user inputs.

4. The method of claim 1, wherein the method further comprises the step of a configuration manager statically configuring/reconfiguring said first memory segment for said one or more co-simulation runs, as a memory segment configured to be eligible to have selected portions dynamically as well as statically configured/reconfigured for all or selected portions of said one or more co-simulation runs, for either unoptimized accesses or optimized accesses, in response to user inputs.

5. The method of claim 4, wherein the method further comprises the step of said configuration manager statically configuring/reconfiguring for said one or more co-simulation runs, wait states for optimized memory read as well as write accesses, and optionally initial values, for said first memory segment, in response to user inputs.

6. The method of claim 4, wherein the method further comprises the step of said configuration manager statically configuring/reconfiguring for said one or more co-simulation runs, a second memory segment for unoptimized accesses only, in response to user inputs.

7. The method of claim 4, wherein the method further comprises the step of said configuration manager statically configuring/reconfiguring said one or more co-simulation runs, a second memory segment for optimized accesses only, in response to user inputs.

8. The method of claim 4, wherein the method further comprises the step of said configuration manager statically or dynamically configuring/reconfiguring for all or selected portions of said one or more co-simulation runs, a first portion of said first memory segment for unoptimized/ optimized accesses, in response to user inputs.

9. The method of claim 1, wherein said method further comprises the step of said co-simulation optimization manager periodically suspending said simulation of software execution, switching from said simulation of software execution to said simulation of hardware operations, and subsequently returning to said simulation of software execution during said one or more co-simulation runs, such that simulation time can be dynamically as well as statically configured/reconfigured to be optimized, and yet said simulation of hardware operations is nevertheless ensured to advance in a desired manner relative to said simulation of software execution.

10. The method of claim 9, wherein said method further comprises the step of a configuration manager configuring/ reconfiguring for said one or more co-simulation runs, whether said hardware operations simulation and said software execution simulation are to be performed with or without simulation time optimization, in response to user inputs.

11. The method of claim 10, wherein said co-simulation optimization manager performs said suspending, switching and subsequently returning at each instruction boundary, whenever a portion of a co-simulation run is configured/ reconfigured with said hardware operations simulation and said software execution simulation to be performed without simulation time optimization.

12. The method as set forth in claim 10, wherein said co-simulation optimization manager suspends said software execution simulation, and switches to said hardware operations simulation, whenever an unoptimized memory access is encountered, and then returns to said software execution simulation, when bus cycles for the unoptimized memory access encountered are completed, whenever a portion of a co-simulation run is configured/re-configured with said hardware operations simulation and said software execution simulation to be performed with simulation time optimized.

13. The method of claim 10, wherein said method further comprises the step of said configuration manager optionally configuring/reconfiguring for all or selected portions of said one or more co-simulation runs, to have said software execution simulation performed with a software simulation clock cycle quantity, with or without said hardware simulation performed with an associated hardware simulation clock cycle quantity, in response to user inputs, whenever a portion of a co-simulation run is configured with said hardware operations simulation and said software execution simulation to be performed with simulation time optimized.

14. The machine implemented method as set forth in claim 13, wherein said co-simulation optimization manager suspends said software execution simulation, and switches to said hardware operations simulation, whenever either an unoptimized memory access is encountered or software execution simulation has advanced by the software simulation clock cycle quantity, and then subsequently returns to said software execution simulation, when either bus cycles for an unoptimized memory access encountered are completed or hardware operations simulation has advanced by a default clock cycle quantity, or by a hardware simulation clock cycle quantity, whenever a portion of a co-simulation run is configured to have said hardware operations simulation and said software execution simulation performed with simulation time optimization, in conjunction with a software simulation clock cycle quantity;

said co-simulation optimization manager subsequent returns to said software execution simulation when bus cycles for an unoptimized memory access encountered are completed, if the suspending and switching occurred as a result of the unoptimized memory access was encountered, said co-simulation optimization manager subsequent returns to said software execution simulation after said hardware simulation has advanced by a default clock cycle quantity, if the suspending and switching occurred as a result of said software simulation having advanced by the software simulation clock cycle quantity, and the portion of the co-simulation run is not configured with said hardware operations simulation to be performed with a hardware simulation clock cycle quantity; and said co-simulation optimization manager subsequent returns to said software execution simulation occurs after said hardware simulation has advanced by a hardware simulation clock cycle quantity if the suspending and switching occurred as a result of said software simulation having advanced by the software simulation clock cycle quantity, and the portion of the co-simulation run is also configured with said hardware operations simulation to be performed with the hardware simulation clock cycle quantity.

15. The method of claim 1, wherein the method further comprises the step of a configuration manager statically establishing for said one or more co-simulation runs, communication channels for said logic simulator and compiled simulation code of said one or more software execution environments to communicate with each other, in response to user inputs.

16. The method of claim 1, wherein the method further comprises the step of a configuration manager statically associating for said one or more co-simulation runs, bus interface model instances for one or more processors, with compiled simulator code of said one or more software execution environments for the one or more processors, in response to user inputs.

17. In an optimizing hardware-software co-simulator, a method for co-simulating a hardware-software system having memory, the method comprising the steps of:

simulating hardware operations for one or more co-simulation runs with one or more bus interface model instances modeling one or more processors, one or more memory model instances modeling one or more memory types, and a logic simulator controlling the bus interface model instances and the memory instances;

simulating software execution for said one or more co-simulation runs with one or more software execution environments; and periodically suspending said simulation of software execution, switching from said simulation of software execution to said simulation of hardware operations, and subsequently returning to said simulation of software execution during said one or more co-simulation runs, with a co-simulation optimization manager, such that simulation time can dynamically as well as statically configured/reconfigured to be optimized, and yet said simulation of hardware operations is nevertheless ensured to advance in a desired manner relative to said simulation of software execution.

18. The method of claim 17, wherein said method further comprises the step of a configuration manager configuring/reconfiguring for said one or more co-simulation runs, whether said hardware operation simulation and software execution simulation are to be performed with or without simulation time optimization, in response to user inputs.

19. The method of claim 18, wherein said co-simulation optimization manager performs said suspending, switching and subsequently returning at each instruction boundary, whenever a portion of a co-simulation run is configured/reconfigured with said hardware operations simulation and said software execution simulation to be performed without simulation time optimization.

20. The method as set forth in claim 18, wherein said co-simulation optimization manager suspends said software execution simulation, and switches to said hardware operations simulation, whenever an unoptimized memory access is encountered, and then returns to said software execution simulation, when bus cycles for the unoptimized memory access encountered are completed, whenever a portion of a co-simulation run is configured/re-configured with said hardware operation simulation and said software execution simulation to be performed with simulation time optimized.

21. The method of claim 18, wherein said method further comprises the step of said configuration manager optionally configuring/reconfiguring for all or selected portions of said one or more co-simulation runs, to have said software execution simulation performed with a software simulation clock cycle quantity, with or without said hardware operations simulation performed with an associated hardware simulation clock cycle quantity, whenever a portion of a co-simulation run is configured with said hardware operations simulation and said software execution simulation to be performed with simulation time optimized, in response to user inputs.

22. The method as set forth in claim 18, wherein said co-simulation optimization manager suspends said software execution simulation and switches to said hardware operations simulation whenever either an unoptimized memory access is encountered or software execution simulation has advanced by the software simulation clock cycle quantity, and then subsequently returns to said software execution simulation, when either bus cycles for an unoptimized memory access encountered are completed or hardware operations simulation has advanced by a default clock cycle quantity, or by a hardware simulation clock cycle quantity, whenever a portion of a co-simulation run is configured to have said hardware operations simulation and said software execution simulation performed with simulation time optimization, in conjunction with a software simulation clock cycle quantity;

said co-simulation optimization manager subsequently returns to said software execution simulation occurs when bus cycles for an unoptimized memory access encountered are completed, if said co-simulation optimization manager performed said suspending and switching as a result of the unoptimized memory access having been encountered, said co-simulation optimization manager subsequently returns to said software execution simulation after said hardware simulation has advanced by a default clock cycle quantity, if said co-simulation optimization manager performed the suspending and switching as a result of said software simulation having advanced by the software simulation clock cycle quantity, and the portion of the co-simulation run is not configured with said hardware operation simulation to be performed with a hardware simulation clock cycle quantity; and said co-simulation optimization manager subsequently returns to said software execution simulation after said hardware simulation has advanced by a hardware simulation clock cycle quantity if said co-simulation optimization manager performed the suspending and switching as a result of said software simulation having advanced by the software simulation clock cycle quantity, and the portion of the co-simulation run is also configured with said hardware operations simulations to be performed with the hardware simulation clock cycle quantity.

23. An optimizing hardware-software co-simulator comprising:

one or more bus interface models for modeling one or more processors;

one or more memory models for modeling one or more types of memory;

a logic simulator for controlling instances instantiated from said one or more bus interface models and from said one or more memory models to simulate hardware operations of a hardware-software system having memory for one or more co-simulation runs;

one or more software execution environments for simulating software execution of said hardware-software system for said one or more co-simulation runs; and a co-simulation optimization manager for concurrently facilitating, for one or more co-simulation runs, a single coherent view of the memory of the hardware-software system by said hardware operations and software execution simulations, such that selected portions of at least a first memory segment of the memory can be dynamically as well as statically configured/reconfigured for either unoptimized accesses or optimized accesses, wherein unoptimized accesses are performed through simulated hardware operations, and optimized accesses are performed through an alternate route, without simulating hardware operations.

24. The optimizing hardware-software co-simulator of claim 23, wherein said optimizing hardware-software co-simulator further includes a configuration manager for statically establishing for said one or more co-simulation runs, communication channels for said logic simulator and instruction set simulators of said one or more software execution environments to communicate with each other.

25. The optimizing hardware-software co-simulator of claim 23, wherein said optimizing hardware-software co-simulator further includes a configuration manager for statically associating for said one or more co-simulation runs, one or more bus interface model instances instantiated from said one or more bus interface models for one or more processors, with instruction set simulators of said one or more software execution environments for the one or more processors.

26. The optimizing hardware-software co-simulator of claim 23, wherein said optimizing hardware-software co-simulator further includes a configuration manager for statically configuring/reconfiguring said first memory segment for said one or more co-simulation runs, as a memory segment configured to be eligible to have selected portions dynamically as well as statically configured/re-configured for all or selected portions of said one or more co-simulation runs, for either unoptimized accesses or optimized accesses.

27. The optimizing hardware-software co-simulator of claim 26, wherein said configuration manager is further used for statically configuring/reconfiguring for said one or more co-simulation runs, wait states for optimized memory read as well as write accesses, and optionally initial values, for said first memory segment.

28. The optimizing hardware-software co-simulator of claim 26, wherein said configuration manager is further used for statically configuring/reconfiguring for said one or more co-simulation runs, a second memory segment for unoptimized accesses only.

29. The optimizing hardware-software co-simulator of claim 26, wherein said configuration manager is further used for statically configuring/reconfiguring for said one or more co-simulation runs, a second memory segment for optimized accesses only.

30. The optimizing hardware-software co-simulator of claim 26, wherein said configuration manager is further used for statically or dynamically configuring/reconfiguring for all or selected portions of said one or more co-simulation runs, a first portion of said first memory segment for unoptimized/optimized accesses.

31. The optimizing hardware-software co-simulator of claim 23, wherein said co-simulation optimization manager is further used for periodically suspending said simulation of software execution, switching from said simulation of software execution to said simulation of hardware operations, and subsequently returning to said simulation of software execution during said one or more co-simulation runs, such that simulation time can dynamically as well as statically configured/reconfigured to be optimized, and yet said simulation of hardware operations is nevertheless ensured to advance in a desired manner relative to said simulation of software execution.

32. The optimizing hardware-software co-simulator of claim 31, wherein said optimizing hardware-software co-simulator further includes a configuration manager for configuring/reconfiguring for said one or more co-simulation runs, whether said hardware operations and software execution simulations are to be performed with or without simulation time optimization.

33. The optimizing hardware-software co-simulator of claim 32, wherein said optimizing hardware-software co-simulator is further used for performing said suspending, switching and subsequently returning at each instruction boundary, whenever a portion of a co-simulation run is configured/reconfigured with said hardware operations and software execution simulations to be performed without simulation time optimization.

34. The optimizing hardware-software co-simulator as set forth in claim 32, wherein optimizing hardware-software co-simulator suspends said software execution simulation and switches to said hardware operations simulation whenever an unoptimized memory access is encountered, and then returns to said software execution simulation when bus cycles for the unoptimized memory access encountered are completed, whenever a portion of a co-simulation run is configured/re-configured with said hardware operations and software execution simulations to be performed with simulation time optimized.

35. The optimizing hardware-software co-simulator of claim 32, wherein said optimizing hardware-software co-simulator further includes a configuration manager for optionally configuring/reconfiguring for all or selected portions of said one or more co-simulation runs, to have said software execution simulation performed with a software simulation clock cycle quantity, with or without said hardware operations simulation performed with an associated hardware simulation clock cycle quantity, whenever a portion of a co-simulation run is configured with said hardware operations and software execution simulations to be performed with simulation time optimized.

36. The optimizing hardware-software co-simulator as set forth in claim 35, wherein said co-simulator optimization manager suspends said software execution simulation, and switches to said hardware operations simulation, whenever either an unoptimized memory access is encountered or software execution simulation has advanced by the software simulation clock cycle quantity, and then subsequently return, to said software execution simulation, when either bus cycles for an unoptimized memory access encountered are completed or hardware operations simulation has advanced by a default clock cycle quantity, or by a hardware simulation clock cycle quantity, whenever a portion of a co-simulation run is configured to have said hardware operations and software execution simulations performed with simulation time optimization, in conjunction with a software simulation clock cycle quantity;

said co-simulation optimization manager subsequent returns to said software execution simulation when bus cycles for an unoptimized memory access encountered are completed, if said co-simulation optimization manager performed the suspending and switching as a result of the unoptimized memory access was encountered, said co-simulation optimization manager subsequent returns to said software execution simulation after said hardware simulation has advanced by a default clock cycle quantity, if said co-simulation optimization manager performed the suspending and switching as a result of said software simulation having advanced by the software simulation clock cycle quantity, and the portion of the co-simulation run is not configured with said hardware operations simulation to be performed with a hardware simulation clock cycle quantity; and said co-simulation optimization manager subsequent returns to said software execution simulation after said hardware simulation has advanced by a hardware simulation clock cycle quantity if said co-simulation optimization manager performed the suspending and switching as a result of said software simulation having advanced by the software simulation clock cycle quantity, and the portion of the co-simulation run is also configured with said hardware operations simulation to be performed with the hardware simulation clock cycle quantity.

37. The optimizing hardware-software co-simulator of claim 23, wherein said optimizing hardware-software co-simulator further includes a configuration manager for statically establishing for said one or more co-simulation runs, communication channels for said logic simulator and compiled simulation code of said one or more software execution environments to communicate with each other.

38. The optimizing hardware-software co-simulator of claim 23, wherein said optimizing hardware-software co-simulator further includes a configuration manager for statically associating for said one or more co-simulation runs, one or more bus interface model instances instantiated from said one or more bus interface models for one or more processors, with compiled simulation code of said one or more software execution environments for the one or more processors.

39. An optimizing hardware-software co-simulator comprising:

one or more bus interface models for modeling one or more processors;

one or more memory models for modeling one or more types of memory;

a logic simulator for controlling instances instantiated from said one or more bus interface models and from said one or more memory models to simulate hardware operations of a hardware-software system having memory for one or more co-simulation runs;

one or more software execution environments for simulating software execution of said hardware-software system for said one or more co-simulation runs; and a co-simulation optimization manager for periodically suspending said simulation of software execution, switching from said simulation of software execution to said simulation of hardware operations, and subsequently returning to said simulation of software execution during said one or more co-simulation runs, such that simulation time can dynamically as well as statically configured/reconfigured to be optimized, and yet said simulation of hardware operations is nevertheless ensured to advance in a desired manner relative to said simulation of software execution.

40. The optimizing hardware-software co-simulator of claim 39, wherein said optimizing hardware-software co-simulator further includes a configuration manager for configuring/reconfiguring for said one or more co-simulation runs, whether said hardware operations and software execution simulations are to be performed with or without simulation time optimization.

41. The optimizing hardware-software co-simulator of claim 40, wherein said co-simulation optimization manager performs said suspending, switching and subsequently returning at each instruction boundary, whenever a portion of a co-simulation run is configured/reconfigured with said hardware operations and software execution simulations to be performed without simulation time optimization.

42. The optimizing hardware-software co-simulator as set forth in claim 40, wherein said co-simulation optimization manager further suspends said software execution simulation, and switches to said hardware operations simulation, whenever an unoptimized memory access is encountered, and then returns to said software execution simulation, when bus cycles for the unoptimized memory access encountered are completed, whenever a portion of a co-simulation run is configured/re-configured with said hardware operations and software execution simulations to be performed with simulation time optimized.

43. The optimizing hardware-software co-simulator of claim 40, wherein configuration manager is further used for optionally configuring/reconfiguring for all or selected portions of said one or more co-simulation runs, to have said software execution simulation performed with a software simulation clock cycle quantity, with or without having said hardware operations simulation performed with an associated hardware simulation clock cycle quantity, whenever a portion of a co-simulation run is configured with said hardware operations and software execution simulations to be performed with simulation time optimized.

44. The optimizing hardware-software co-simulator as set forth in claim 40, wherein said co-simulation optimization manager suspends said software execution simulation, and switches to said hardware operations simulation, whenever either an unoptimized memory access is encountered or software execution simulation has advanced by the software simulation clock cycle quantity, and then subsequently returns to said software execution simulation, when either bus cycles for an unoptimized memory access encountered are completed or hardware operations simulation has advanced by a default clock cycle quantity, or by a hardware simulation clock cycle quantity, whenever a portion of a co-simulation run is configured to have said hardware operations and software execution simulations performed with simulation time optimization, in conjunction with a software simulation clock cycle quantity;

said co-simulation optimization manager subsequently returns to said software execution simulation when bus cycles for an unoptimized memory access encountered are completed, if said co-simulation optimization manager has performed the suspending and switching as a result of the unoptimized memory access having been encountered, said co-simulation optimization manager subsequently returns to said software execution simulation after said hardware simulation has advanced by a default clock cycle quantity, if said co-simulation optimization manager performed the suspending and switching as a result of said software simulation having advanced by the software simulation clock cycle quantity, and the portion of the co-simulation run is not configured with said hardware operation simulation to be performed with a hardware simulation clock cycle quantity; and said co-simulation optimization manager subsequently returns to said software execution simulation after said hardware simulation has advanced by a hardware simulation clock cycle quantity if said co-simulation optimization manager has performed the suspending and switching as a result of said software simulation having advanced by the software simulation clock cycle quantity, and the portion of the co-simulation run is also configured with said hardware operations simulation to be performed with the hardware simulation clock cycle quantity.

* * * * *

UNITED STATES PATENT AND TRADEMARK OFFICE
CERTIFICATE OF CORRECTION

PATENT NO.   : 5,768,567
DATED        : June 16, 1998
INVENTOR(S)  : Russell Klein, Peter Finch, Devon Kehoe It is certified that error appears in the above-identified patent and that said Letters Patent is hereby corrected as shown below:

In column 14 at line 35 delete "as well as" and insert --and/or--.

In column 14 at line 62 delete "as well as" and insert --and/or--.

In column 15 at line 28 delete "as well as" and insert --and/or--.

In column 17 at line 7 delete "dynamically as well as" and insert --be dynamically and/or--.

In column 18 at line 44 delete "as well as" and insert --and/or--.

In column 19 at line 5 delete "as well as" and insert --and/or--.

In column 19 at line 37 delete "as well as" and insert --and/or--.

In column 21 at line 27 delete "dynamically as well as" and insert --be dynamically and/or--.

Signed and Sealed this

Eighth Day of June, 1999

*Attest:*

Q. TODD DICKINSON

*Attesting Officer*   Acting Commissioner of Patents and Trademarks